(12) United States Patent
Armstrong

(10) Patent No.: US 8,896,917 B2
(45) Date of Patent: Nov. 25, 2014

(54) EXTERNAL BEAM DELIVERY SYSTEM USING CATADIOPTRIC OBJECTIVE WITH ASPHERIC SURFACES

(75) Inventor: J. Joseph Armstrong, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 496 days.

(21) Appl. No.: 12/737,062

(22) PCT Filed: Jun. 15, 2009

(86) PCT No.: PCT/US2009/003591
§ 371 (c)(1),
(2), (4) Date: Dec. 1, 2010

(87) PCT Pub. No.: WO2009/154731
PCT Pub. Date: Dec. 23, 2009

(65) Prior Publication Data
US 2011/0075138 A1   Mar. 31, 2011

Related U.S. Application Data

(60) Provisional application No. 61/132,438, filed on Jun. 17, 2008.

(51) Int. Cl.
*G02B 17/08* (2006.01)
*G02B 21/10* (2006.01)
*G02B 21/00* (2006.01)
*G02B 21/04* (2006.01)
*G02B 21/12* (2006.01)

(52) U.S. Cl.
CPC ........ *G02B 17/0808* (2013.01); *G02B 21/0016* (2013.01); *G02B 21/125* (2013.01); *G02B 21/04* (2013.01); *G02B 17/0856* (2013.01)
USPC ............ 359/364; 359/708; 359/726

(58) Field of Classification Search
None
See application file for complete search history.

(56) References Cited

U.S. PATENT DOCUMENTS 6,842,298 B1   1/2005   Shafer et al.
2001/0038446 A1   11/2001   Takahashi
(Continued)

FOREIGN PATENT DOCUMENTS

JP   2001/517806   10/2001
WO   WO 99/08134   2/1999
(Continued)

OTHER PUBLICATIONS

Karl Bystricky and Paul R. Yoder Jr. Catadioptric lens with aberrations balanced by aspherizing one surface. Applied Optics, vol. 24, No. 8, Apr. 15, 1985 pp. 1206-1208.
European Search Report dated Dec. 20, 2013.

*Primary Examiner* — Derek S Chapel
(74) *Attorney, Agent, or Firm* — Smyrski Law Group, A P.C.

(57) ABSTRACT

An inspection system including a catadioptric objective that facilitates dark-field inspection is provided. The objective includes an outer element furthest from the specimen having an outer element partial reflective surface oriented toward the specimen, an inner element nearest the specimen having a center lens comprising an inner element partial reflective surface oriented away from the specimen, and a central element positioned between the outer lens and the inner lens. At least one of the outer element, inner element, and central element has an aspheric surface. The inner element is spatially configured to facilitate dark-field inspection of the specimen.

31 Claims, 8 Drawing Sheets

(56) References Cited

U.S. PATENT DOCUMENTS

2004/0240047 A1  12/2004  Shafer et al.
2006/0158720 A1   7/2006  Chuang et al.
2006/0238856 A1* 10/2006  Shafer et al. .................. 359/366

FOREIGN PATENT DOCUMENTS

| WO | WO 2006/105122 | 10/2006 |
| WO | WO 2006/107527 | 10/2006 |
| WO | WO 2007/005340 |  1/2007 |

* cited by examiner

EXTERNAL BEAM DELIVERY SYSTEM USING CATADIOPTRIC OBJECTIVE WITH ASPHERIC SURFACES

This application claims the benefit of U.S. Provisional Patent Application 61/132,438, entitled "External Beam Delivery System Using Catadioptric Objective with Aspheric Surfaces," inventor J. Joseph Armstrong, filed Jun. 17, 2008, which is incorporated herein by reference.

BACKGROUND OF THE INVENTION

1. Field of the Invention

The present invention relates generally to the field of optical imaging, and more specifically to catadioptric optical systems used for bright-field and dark-field optical inspection applications.

2. Description of the Related Art

Many optical and electronic systems inspect surface features for defects such as those on a partially fabricated integrated circuit or a reticle. Defects may take the form of particles randomly localized on the surface, scratches, process variations such as under etching, and so forth. Such inspection techniques and devices are well known in the art and are embodied in various commercial products such as many of those available from KLA-Tencor Corporation of San Jose, Calif.

Several different imaging modes exist for optical inspection. These include bright-field and various dark-field imaging modes. Each of these imaging modes is provided to attempt to detect different types of defects. The oblique dark-field mode is one of the most sensitive and stable dark-field modes. The requirements for a state of the art semiconductor inspection system include high numerical aperture (NA), large field size, reasonable bandwidth, and UV-DUV wavelength. When combined with the beam delivery and low scattering requirements of oblique dark-field imaging, finding a suitable design for advanced specimen inspection becomes very challenging.

Examples of optical systems that can support semiconductor inspection include high NA UV-DUV catadioptric systems with large field sizes are shown in U.S. Pat. No. 5,717, 518 by Shafer et al., and U.S. Pat. No. 6,064,517 by Chuang et al.

These previous designs can, in certain circumstances, exhibit beam delivery issues when performing oblique dark-field imaging. In these systems, one method for implementing the oblique dark-field mode uses a collimated beam of monochromatic light illuminating the wafer from inside the optical system within the NA defined by the objective. However, small amounts of scattered and reflected light from lens elements using this design can produce optical noise at levels that compromise sensitivity. Laser illumination can be introduced near the pupil in the focusing lens group or from an alternate pupil location within the catadioptric group. These methods of illumination can cause a significant amount of back-scattered and reflected light from the multiple lens surfaces traversed by the illuminating light. Forward-scattered light from the specularly reflected component off the wafer can also be a significant potential problem.

One previous method for achieving oblique laser dark-field illumination and imaging uses a collimated beam of monochromatic light to illuminate a semiconductor wafer from or originating outside the imaging objective. This mandates use of a long working distance objective to allow access by the laser to the area of interest on the semiconductor wafer. Objectives used in dark-field applications of this type are generally refractive objectives limited to NAs less than 0.7, corresponding to collection angles of only up to 44 degrees from normal. A major drawback of this approach is the small imaging NA that limits the amount of scattered light that can be collected. Another drawback is the small spectral bandwidth and small field size that are typical of refractive UV-DUV objectives.

Another previous solution uses a catadioptric objective with a nosepiece to allow external oblique illumination. Such objectives exclusively employ spherical optical surfaces and have certain issues when implemented.

It would therefore be desirable to have a system for inspecting a specimen that improves upon the systems previously available, and in particular for enabling inspection of specimens such as wafers using an oblique dark-field inspection mode. It would be particularly desirable to offer systems or designs that may be used under various circumstances and with various components that overcome the imaging issues associated with previously known designs.

SUMMARY OF THE INVENTION

According to one aspect of the present design, a catadioptric objective is provided. The catadioptric objective includes an outer element furthest from the specimen and comprising an outer element partial reflective surface oriented toward the specimen, an inner element nearest the specimen comprising an inner element partial reflective surface oriented away from the specimen, and a central element positioned between the outer lens and the inner lens. At least one of the outer element, inner element, and central element comprises an aspheric surface. The inner element is spatially configured to facilitate dark-field inspection of the specimen.

According to a second aspect of the present design, there is provided an objective configured to inspect a specimen using dark-field illumination. The objective includes a Mangin element comprising a reflective surface positioned substantially proximate the specimen in an orientation causing light energy to reflect away from the specimen, a catadioptric element comprising a substantially curved reflective surface positioned to reflect light energy toward the specimen, and an intermediate lens configured to receive light energy reflected from the Mangin element and the catadioptric element. The intermediate lens is configured to operate in triple pass, wherein triple pass indicates at least part of light energy received at the objective passes through the intermediate lens three times. At least one of the Mangin element, catadioptric element, and intermediate lens comprises an aspheric surface. The Mangin element is spatially configured to facilitate dark-field inspection of the specimen.

These and other advantages of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which.

DETAILED DESCRIPTION OF THE INVENTION

Figure 1:
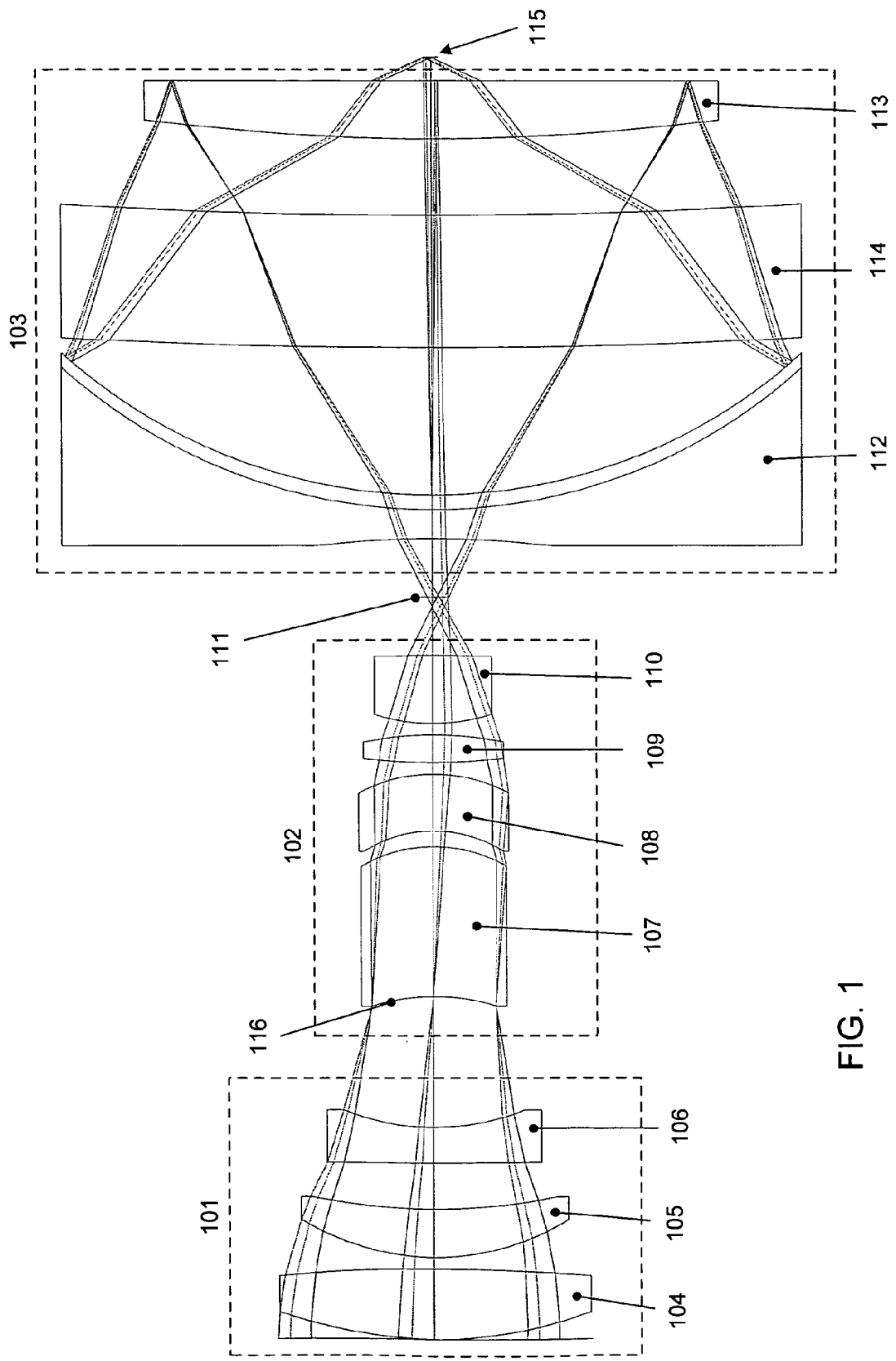
FIG. 1 is a catadioptric imaging system with a two surface Mangin element and 2.5 mm field suitable for use with external beam delivery, using an aspheric surface on the first surface of one element.

A catadioptric objective configured to inspect a specimen is provided. The objective includes a plurality of lenses, an element with an aspheric surface shape, and the design supports a bandwidth of at least 0.25 nm. The objective may be successfully employed in oblique laser dark-field mode inspection of specimens, such as semiconductor wafers.

Oblique laser dark-field inspection relies on detecting light scattered from a defect on a specimen, such as a semiconductor wafer. Inspection systems employing oblique laser dark-field mode can detect defects sized below the resolution of the optical system. Flat areas on the specimen that scatter minimal light toward the detector produce a dark image. Any surface anomalies or features protruding above the object tend to scatter light toward the detector, and when inspecting objects such as semiconductor wafers, dark-field imaging yields bright areas representing features, particles, or other irregularities on a dark background.

Scattered light from the defect collected by the imaging system is generally a very small percentage or portion of the illuminating light. Any stray light collected by the imaging system and not produced by the defect makes the defect more difficult to distinguish. Current semiconductor inspection tends to employ designs that collect as much scattered light as possible while minimizing the amount of stray light collected. Such designs and the results obtained therefrom are materially affected by consider both the beam delivery system and the imaging optics. Collection of as much light as possible tends to occur with an imaging system exhibiting a high NA (numerical aperture).

Light wavelength also affects the quality of the image received. Shorter wavelength light typically causes increased light scattering. The portion of scattered light tends to be larger for UV or DUV wavelengths relative to visible wavelengths. It can therefore be highly advantageous to perform oblique dark-field scattering using wavelengths in the UV-DUV spectral region. Further, semiconductor inspection of wafers or reticles is preferably performed as quickly as possible. Imaging systems that exhibit relatively large field sizes can scan wafers at higher speeds, and thus larger field sizes are beneficial in such scanning.

UV-DUV optical designs with large field sizes and large NAs are typically limited to catadioptric systems. Previously, beam delivery with oblique illumination using catadioptric systems has been limited to "inside the lens" type beam delivery. Inside the lens beam delivery tends to produce significant amounts of unwanted reflected and scattered light from lens and mirror surfaces. In contrast, oblique incidence illumination results in dark-field imaging when beam delivery components are aligned such that specular reflection from the inspected surface is directed away from the imaging optics and is not collected. Both the illuminating light and the specularly reflected light are outside the objective lens so that scattering noise from the imaging optics is not a concern. Thus it can be highly beneficial to avoid inside the lens type beam delivery in UV and DUV environments.

Previous imaging designs have utilized a catadioptric objective with a nosepiece, and all surfaces have typically been spherical. A nosepiece is that part of the device, such as a microscope, that holds the objective lenses. In the past, the nosepiece tended to minimize aberration and limit the central obscuration. The present design uses aspherical surfaces within an objective without the need for a nosepiece. The present design advantageously increases the NA beyond 0.9, improves the performance at 0.9 NA, or simplifies the design by removing the need for certain lens elements. Supported NAs in the present design may be in excess of, for example, 0.90, 0.94, or 0.96.

The present design can support both broad-band brightfield inspection and oblique laser dark-field inspection techniques without compromising the performance of either technique. To accomplish this enhanced dual-mode inspection capability, both inspection techniques generally use the same imaging system, detection system, and autofocus system. However, the catadioptric designs and illumination systems employed differ from those previously available.

In the present design, laser light illuminates the sample from between the Mangin element and the sample using components located completely outside the objective. Illumination is achieved by the combination of a unique three surface Mangin element and beam delivery optics. In addition, a Fourier filter or other pupil aperture can be employed for the oblique laser dark-field mode. A detector with a suitable dynamic range may be employed in the detection system to handle the high dynamic range signals produced by the oblique dark-field inspection technique.

It should be particularly noted that the construction of objective elements as presented herein provides the beneficial performance desired. As is understood to those skilled in the art, one simply cannot take a currently available objective and obtain a reasonably performing objective having the performance discussed herein. It is the unique arrangement of elements provided herein that enable the performance and functionality discussed, such as NA, field size, and color performance, for example.

FIG. 1 illustrates one embodiment according to the present design. This design uses an aspheric surface to allow an extended working distance without using a nosepiece. The design comprises a reduction lens group 101, a focusing lens group 102, and a catadioptric group 103. The reduction lens group 101 includes lenses 104-106, the field lens group 102 includes lenses 107-110, and the catadioptric group 103 includes elements 112-114. Light energy is received from the left side of FIG. 1 for brightfield type illumination or through the lens dark-field illumination. Reduction lens group 101 reduces the beam diameter and transfers light energy to focusing lens group 102. Focusing lens group 102 then forms intermediate image 111 in proximity to the vertex of Mangin element 112 in catadioptric group 103. The catadioptric group 103 comprises three elements including a mirror element 112, lens element 113 used in triple pass, and a Mangin element 114. The three element arrangement for the catadioptric group 103 places the lens 113 between the Mangin element 112 and Mangin element 114.

As is true for the entirety of the present discussion, element number 115 points to a position where a sample, specimen, or wafer would be located, but the sample, specimen or wafer is not shown in this view. FIGS. 2-7 also present numbering representing the sample, specimen or wafer, and arrows pointing to the general position where the sample, specimen or wafer would be located, but the sample, specimen or wafer is not shown.

One aspect of this design that allows for external oblique illumination is Mangin element 114 being spaced 4 mm from sample 115. Such spacing allows light to illuminate sample 115 by being introduced between the reflective surface of Mangin element 114 and sample 115. This keeps high power illumination light outside the objective. Delivering the light to the sample can be accomplished in a similar manner to that described in currently pending patent application Ser. No. 11/977,998, entitled "External Beam Delivery System for Laser Dark-Field Illumination in a Catadioptric Optical System", inventor J. Joseph Armstrong, filed 25 Oct. 2007 ("the '998 application").

Compared to the '998 application, which uses a three surface catadioptric element, the present design uses an aspheric surface on Mangin element 114 to correct aberrations due to the extended working distance of the objective. In this application the aspheric surface is on the refractive portion of element 114.

The embodiment of FIG. 1 provides certain advantages compared to the three surface Mangin element approach. The diameter of the light on the element surfaces throughout the objective is significantly increased. Light diameter increase is particularly true for surfaces in proximity to the internal image 111, and such an increase also occurs for the surface of Mangin element 114 closest to the sample 115. Such an increase in light diameter tends to reduce the potential for optical damage on these surfaces and also reduces the potential for photocontamination. Angles of incidence are provided to reduce ghost reflections and stray light that can limit the performance of dark-field systems, traditionally an issue for systems with large field angles.

Element thicknesses and positions are also provided to limit coherent interference when using a mode locked laser as an illumination source. Modelocking is generally understood to those skilled in the art to represent a technique whereby the laser produces short pulses, and wherein a fixed phase relationship exists between modes of the laser cavity. Using a mode locked laser, pulses that reflect from element surfaces typically do not overlap in time with themselves or previous pulses, thus limiting temporal interference effects. If a mode locked laser with a 10 ps pulse width and 800 MHz repetition rate is used, the pulse length is 3 mm and the pulse separation is 375 mm. In this case, for a single reflection, two adjacent surfaces exhibit an optical separation of greater than 1.5 mm and individual surfaces have optical separations not exceeding 187.5 plus or minus 1.5 mm.

The present design provides an increased central obscuration relative to the diameter of the spherical mirror 112 when compared to the three surface Mangin element design approach illustrated in the '998 patent application discussed above. The central obscuration of the design in FIG. 1 is 23% of the diameter. The central obscuration for the aspheric design can be reduced by increasing the diameters of the elements in the catadioptric group. Such a design tradeoff can be made by those skilled in the art using FIG. 1 as a starting point.

Table 1 presents the lens prescriptions for the embodiment illustrated in FIG. 1.

TABLE 1

Lens Prescriptions for the design of FIG. 1

| Surf | Radius | Thickness | Glass | Diameter |
| --- | --- | --- | --- | --- |
| OBJ | Infinity | Infinity | | 0.000 |
| 2 | 77.012 | 12.000 | Fused silica | 52.400 |
| 3 | −265.722 | 2.000 | | 50.486 |
| 4 | 42.825 | 8.200 | Fused silica | 44.935 |
| 5 | 103.622 | 7.877 | | 41.827 |
| 6 | 1991.652 | 6.103 | Fused silica | 36.052 |
| 7 | 40.771 | 22.352 | | 30.427 |
| STO | −33.651 | 0.000 | | 20.800 |
| 9 | −33.651 | 25.500 | Fused silica | 20.800 |
| 10 | −23.796 | 2.665 | | 24.317 |
| 11 | −21.482 | 9.736 | Fused silica | 23.290 |
| 12 | −26.119 | 2.000 | | 25.093 |
| 13 | 98.136 | 4.720 | Fused silica | 23.416 |
| 14 | −58.506 | 2.000 | | 22.631 |
| 15 | 33.353 | 11.592 | Fused silica | 19.688 |
| 16 | −149.395 | 9.993 | | 13.382 |
| 17 | Infinity | 9.993 | | 5.672 |
| 18 | −168.578 | 7.500 | Fused silica | 40.000 |
| 19 | 91.029 | 25.208 | | 124.000 |
| 20 | 1098.395 | 22.717 | Fused silica | 124.000 |
| 21 | 982.756 | 13.113 | | 124.000 |
| 22 | 334.988 | 10.000 | Fused silica | 96.000 |
| 23 | Infinity | −10.000 | MIRROR | 96.000 |
| 24 | 334.988 | −13.113 | | 96.000 |
| 25 | 982.756 | −22.717 | Fused silica | 124.000 |
| 26 | 1098.395 | −25.208 | | 124.000 |
| 27 | 91.029 | 25.208 | MIRROR | 124.000 |
| 28 | 1098.395 | 22.717 | Fused silica | 124.000 |
| 29 | 982.756 | 13.113 | | 124.000 |
| 30 | 334.988 | 10.000 | Fused silica | 96.000 |
| 31 | Infinity | 4.000 | | 19.807 |
| IMA | Infinity | | | 2.548 |

As may be appreciated by one skilled in the art, the numbers in the leftmost column of Table 1 represent the surface number counting surfaces from the left of FIG. 1. For example, the left surface of lens 104 in the orientation presented in FIG. 1 (surface 2 in Table 1) has a radius of curvature of 77.012 mm, a thickness of 12.000 mm, and the rightmost surface (surface 3) has a radius of curvature of −265.722 mm, and is 2.0 mm from the next surface. The material used is fused silica.

In the design presented in FIG. 1, the refractive side of Mangin element 114 has an aspheric shape. Many equations can be used to represent an aspheric shape. The following equation is used to represent the aspheric surfaces for the lens prescription in Table 1.

$$z = \frac{cr^2}{1 + \sqrt{1 - (1+k)c^2r^2}} + \sum_{i=1}^{N} \alpha_i \rho^{2i}, \quad (1)$$

where z is the sag or the distance from the surface to the plane tangent to the element vertex. The first expression represents the sag of a standard spherical surface where c is the surface curvature or the inverse of the radius of curvature. The parameter r can range from 0 to one half of the element diameter. The parameter k is called the conic constant. For spherical surfaces, k is equal to 0. The aspheric terms are in the summation. Here N is the number of aspheric terms, ρ is the normalized element radius (half of the element diameter), and α are the aspheric coefficients.

For the design shown in FIG. 1, Table 2 lists the parameters for the aspheric surface. The refractive side of element 114 is listed in Table 1 as surface 22, surface 24, and surface 30. The side of an element has one surface entry in the Table for each time light interacts with that surface.

TABLE 2

Aspheric surface parameters for the lens prescription in Table 1.

|  | Surf 22, 24, 30 |
|---|---|
| Conic constant (k) | 0 |
| Maximum half diameter (r) mm | 56.638 |
| Curvature (c) 1/mm | 0.002985 |
| $\alpha_1$ | 0 |
| $\alpha_2$ | −0.24651 |
| $\alpha_3$ | −1.26261 |
| $\alpha_4$ | 13.16165 |
| $\alpha_5$ | −67.1355 |
| $\alpha_6$ | 188.6751 |
| $\alpha_7$ | −302.93 |
| $\alpha_8$ | 250.6833 |
| $\alpha_9$ | −71.9209 |
| $\alpha_{10}$ | −13.1656 |

In the design presented in FIG. 1, the numerical aperture may approach or even exceed approximately 0.9 in air. From FIG. 1, the reducing lens group has the ability to receive light energy and transmit light energy to the objective pupil location 116. The focusing lens group 102 has the ability to receive light energy and transmit focused light energy and form intermediate image 111. The catadioptric group or Mangin mirror arrangement 103 receives the intermediate energy and provides controlled light energy to the specimen 115. Alternately, the reflected path originates at the specimen, and light reflected or scattered from the specimen is received by the catadioptric group or Mangin mirror arrangement 103 and forms and transmits reflected light energy. The focusing lens group 102 receives resultant light energy and transmits light energy to an aperture stop 116. An aperture or mask can be placed at the aperture stop 116 to limit or modify the NA of the objective. In addition, a central obscuration may be placed at the surface located at aperture stop 116 that matches the central obscuration in the catadioptric group 103. Such central obscuration matching can help limit stray light reaching any detection system.

The design presented in FIG. 1 and Table 1 thus uses a single glass material, fused silica. Other materials may be employed, but fused silica or any material used within the design may require low absorption over the range of wavelengths supported by the objective design. Fused silica offers relatively high transmission properties for light energy from 190 nm through the infrared wavelengths. Because of the single material design of the ultra-high NA objective, fused silica can enable the design to be re-optimized for any center wavelength in this wavelength range. For example, the design can be optimized for use with lasers at 193, 198.5, 213, 244, 248, 257, 266, 308, 325, 351, 355, or 364 nm. In addition, if calcium fluoride is employed as a glass or lens material, the design can be employed with an excimer laser operating at 157 nm. Re-optimization can require a slight tuning or altering of components, and may generally be within the abilities of those skilled in the art.

The design of FIG. 1 operates in the presence of light energy at a 266 nm wavelength with a 1 nm bandwidth and exhibits a field size of approximately 2.5 mm. Field size in this arrangement represents the size of the area on the specimen that can be imaged by the system with minimum degradation in optical performance. The design of FIG. 1 has a polychromatic Strehl Ratio of better than 0.97 across the field. Further correction of residual aberrations using additional imaging optics is also possible, where further correction can increase the optical specifications, including but not limited to bandwidth or field size. The maximum element diameter for the embodiment illustrated in FIG. 1 is approximately 124 mm. The decenter tolerance for this design is extremely loose. For a 10 micron decenter, the worst polychromatic wavefront error introduced is 0.18 waves. Previous designs using a three surface Mangin element were on the order of twice as sensitive.

The design of FIG. 1 is self corrected, where self corrected in this context means that the objective does not require any additional optical components to correct aberrations in order to achieve inspection design specifications. In other words, no additional components are needed to provide a generally aberration free image, or the objective provides substantially complete images without need for additional compensation. The ability to self correct can provide for simpler optical testing metrology and optical alignment to other self corrected imaging optics.

Beam delivery in the context of FIG. 1 and the other embodiments of the current design may entail the objective being configured to be employed with a laser beam delivery system external to the objective and in proximity to the Mangin element. The laser beam delivery system may deliver a laser beam to the specimen and the objective is positioned or oriented to accommodate the laser beam and perform darkfield inspection. In such an arrangement, the laser beam may be directed to the specimen via prisms, reflective surfaces, beam directing elements attached to the Mangin element, or beam directing elements supported on a surface formed separately from the Mangin element.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible. Optimizing the design for higher NAs would generally limit the field size or bandwidth and may require slightly increased diameter objective elements. Aspheric surfaces can be placed on other elements in the reduction lens group 101, focusing lens group 102, and catadioptric group 103 with the result of removing the nose piece, improving the design performance, or reducing the manufacturing tolerances. Thus it should be appreciated that the combination of performance characteristics or functionality of the present design is particularly noteworthy and has generally not been accomplished in previously known objective designs.

The design of FIG. 1 provides a relatively low intrinsic polychromatic wavefront aberration over the design bandwidth of 1 nm. The low wavefront aberration provides increased manufacturing headroom, or ease of manufacture, while enabling relatively high performance of the manufactured objective.

Figure 2:
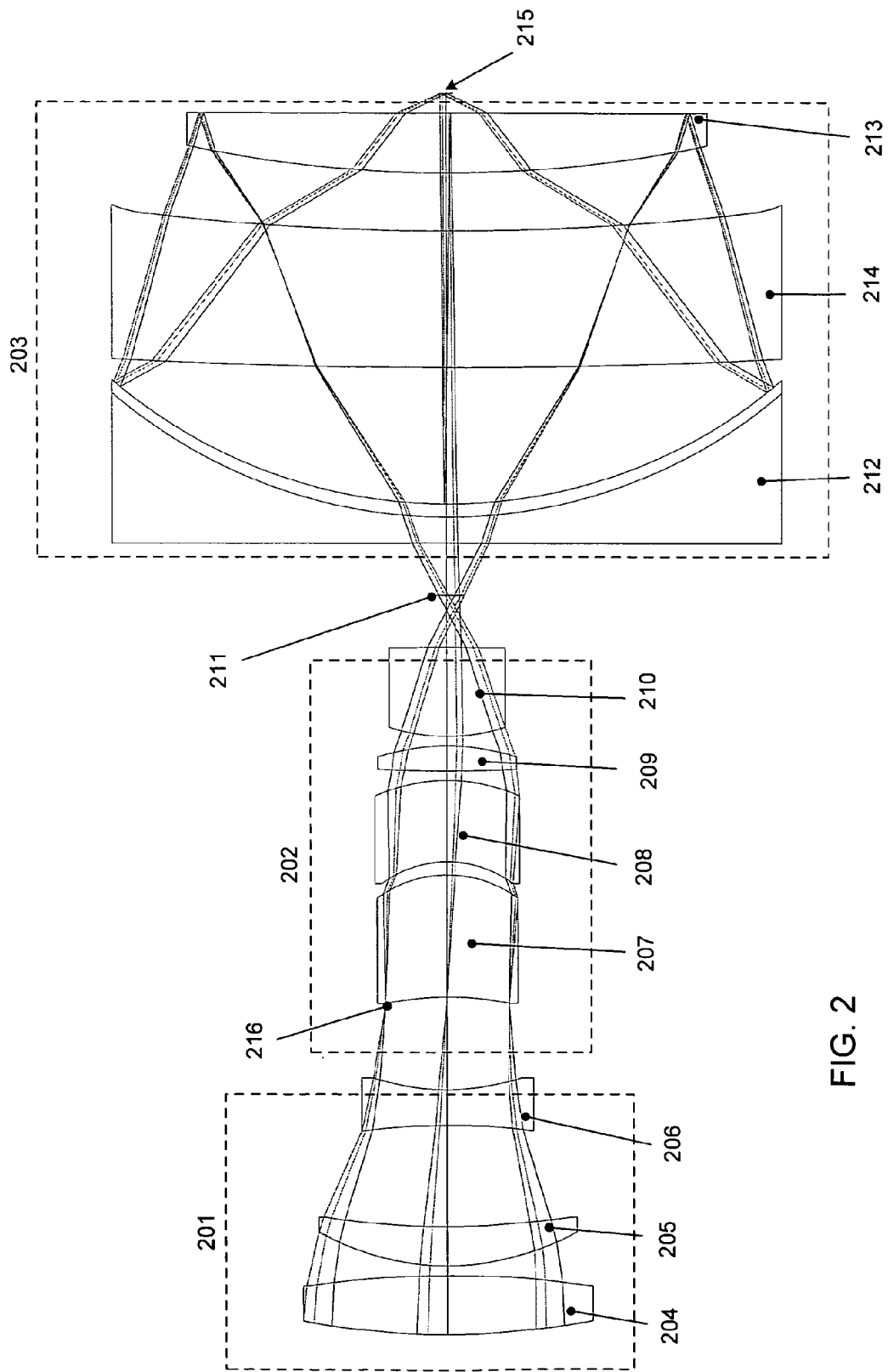
FIG. 2 is a catadioptric imaging system with a two surface Mangin element and 2.5 mm field suitable for use with external beam delivery using an aspheric surface on the second surface of one element.

FIG. 2 illustrates an alternate embodiment according to the present design. This design uses an aspheric surface to allow an extended working distance without using a nosepiece. The design comprises a reduction lens group 201, a focusing lens group 202, and a catadioptric group 203. The reduction lens group 201 includes lenses 204-206, the field lens group 202 includes lenses 207-210, and the catadioptric group 203 includes elements 212-214. Light energy is received from the left side of FIG. 2 for brightfield type illumination. Reduction lens group 201 reduces the beam diameter and transfers light energy to focusing lens group 202. Focusing lens group 202 then forms intermediate image 211 in proximity to the vertex of Mangin element 212 in catadioptric group 203. The catadioptric group 203 comprises three elements including a mirror element 212, lens element 213 used in triple pass, and a Mangin element 214. The three element arrangement for the catadioptric group 203 places the lens 213 between the Mangin element 212 and Mangin element 214.

One aspect of this design that allows for external oblique illumination is Mangin element 214 spaced 4 mm from sample 215. Such spacing allows light to illuminate sample 215 by being introduced between the reflective surface of Mangin element 214 and sample 215 and keeps high power illumination light virtually completely outside the objective. Delivering light to the sample can be accomplished in a similar manner to that described in the '998 patent application discussed above.

Compared to the previous patent application utilizing the three surface catadioptric element, the design of FIG. 2 uses an aspheric surface on element 213 to correct aberrations due to the extended working distance of the objective. In this application the aspheric surface is on the surface of element 213 nearest the sample 215.

The embodiment of FIG. 2 also has additional advantages compared to the three surface Mangin element approach. The diameter of the light on the element surfaces throughout the objective is significantly increased, particularly for surfaces in proximity to the internal image 211 and the surface of Mangin element 214 closest to the sample 215. Increased light diameter on element surfaces tends to reduce the potential for optical damage of these surfaces and reduces potential photocontamination. The angles of incidence are chosen to reduce ghost reflections and stray light that can limit the performance of dark-field systems, which is particularly true for systems having large field angles.

Element thicknesses and positions are also chosen to limit any coherent interference when using a modelocked laser as an illumination source, as described above.

The design approach of the embodiment of FIG. 2 has an increased central obscuration relative to the diameter of the spherical mirror 212 when compared to the three surface Mangin element design approach used in the '998 patent application discussed above. The central obscuration of the design in FIG. 2 is 22% of the diameter. The central obscuration for the aspheric design can be reduced if the elements in the catadioptric group are allowed to increase in diameter. Such a design tradeoff can be made by those skilled in the art using the design of FIG. 2 as a starting point.

Table 3 presents the lens prescriptions for the embodiment illustrated in FIG. 2.

TABLE 3

Lens Prescriptions for the design of FIG. 2

| Surf | Radius | Thickness | Glass | Diameter |
|---|---|---|---|---|
| OBJ | Infinity | Infinity | | 0.000 |
| 1 | 163.550 | 12.000 | Fused silica | 58.022 |
| 2 | −181.058 | 2.000 | | 56.702 |

TABLE 3-continued

Lens Prescriptions for the design of FIG. 2

| Surf | Radius | Thickness | Glass | Diameter |
|---|---|---|---|---|
| 3 | 52.436 | 8.000 | Fused silica | 51.727 |
| 4 | 168.257 | 20.713 | | 49.716 |
| 5 | −119.869 | 7.241 | Fused silica | 34.436 |
| 6 | 48.136 | 18.764 | | 29.731 |
| STO | −59.064 | 0.000 | | 24.752 |
| 8 | −59.064 | 25.000 | Fused silica | 24.752 |
| 9 | −23.076 | 2.664 | | 28.099 |
| 10 | −21.584 | 16.558 | Fused silica | 26.222 |
| 11 | −34.970 | 2.000 | | 28.961 |
| 12 | 280.469 | 5.086 | Fused silica | 27.709 |
| 13 | −43.840 | 2.000 | | 27.232 |
| 14 | 38.895 | 18.238 | Fused silica | 23.267 |
| 15 | −194.495 | 10.595 | | 12.584 |
| 16 | Infinity | 10.595 | | 6.946 |
| 17 | −1000.000 | 8.000 | Fused silica | 16.877 |
| 18 | 100.786 | 28.000 | | 22.050 |
| 19 | 1238.948 | 28.000 | Fused silica | 53.372 |
| 20 | 506.709 | 11.907 | | 73.545 |
| 21 | 246.589 | 12.250 | Fused silica | 94.182 |
| 22 | Infinity | −12.250 | MIRROR | 98.983 |
| 23 | 246.589 | −11.907 | | 103.210 |
| 24 | 506.709 | −28.000 | Fused silica | 113.523 |
| 25 | 1238.948 | −28.000 | | 129.749 |
| 26 | 100.786 | 28.000 | MIRROR | 133.346 |
| 27 | 1238.948 | 28.000 | Fused silica | 118.157 |
| 28 | 506.709 | 11.907 | | 75.527 |
| 29 | 246.589 | 12.250 | Fused silica | 37.835 |
| 30 | Infinity | 4.000 | | 20.207 |
| IMA | Infinity | | | 2.517 |

For the design shown in FIG. 2, Table 4 lists the parameters for the aspheric surface. The definitions of these parameters are as in the previous embodiment. The aspheric surface of element 213 is listed in table 3 as surface 20, surface 24, and surface 28. The side of an element has one surface entry in the Table for each time light interacts with that surface.

TABLE 4

Aspheric surface parameters for the lens prescription in Table 3.

| | Surf 20, 24, 28 |
|---|---|
| Conic constant (k) | 0 |
| Maximum half diameter (r) mm | 56 |
| Curvature (c) 1/mm | 0.0019735 |
| $\alpha_1$ | 0 |
| $\alpha_2$ | −0.000463232 |
| $\alpha_3$ | −0.27280996 |
| $\alpha_4$ | 0.67805237 |
| $\alpha_5$ | −1.6321465 |
| $\alpha_6$ | 3.204255 |
| $\alpha_7$ | −4.6541617 |
| $\alpha_8$ | 4.6077376 |
| $\alpha_9$ | −2.6716425 |
| $\alpha_{10}$ | 0.68135288 |

In the design presented of FIG. 2, the numerical aperture may approach or even exceed approximately 0.9 in air. From FIG. 2, the reducing lens group has the ability to receive light energy and transmit light energy to the objective pupil location 216. The focusing lens group 202 has the ability to receive light energy and transmit focused light energy and form intermediate image 211. The catadioptric group or Mangin mirror arrangement 203 receives the intermediate energy and provides controlled light energy to the specimen 215. Alternately, the reflected path originates at the specimen, and light scattered or reflected from the specimen is received by the catadioptric group or Mangin mirror arrangement 203 and forms and transmits reflected light energy. The focusing lens group 202 receives resultant light energy and transmits light energy to an aperture stop 216. An aperture or mask can be placed at the aperture stop 216 to limit or modify the NA of the objective. In addition, central obscuration may be placed at the surface located at aperture stop 216 that matches the central obscuration in the catadioptric group 203. Such a central obscuration can help limit stray light reaching any detection system.

The design of FIG. 2 typically operates in the presence of light energy at a 266 nm wavelength with a 1 nm bandwidth and can exhibit a field size of approximately 2.5 mm. Field size in this arrangement represents the size of the area on the specimen that can be imaged by the system with minimum degradation in optical performance. The design of FIG. 2 has a polychromatic Strehl Ratio of better than 0.98 across the field. Further correction of residual aberrations using additional imaging optics is also possible, where further correction can increase the optical specifications, including but not limited to bandwidth or field size.

The maximum element diameter for the embodiment illustrated in FIG. 2 is approximately 134 mm. The design of FIG. 2 is self corrected as described with respect to the first embodiment. The design presented in FIG. 2 and Table 2 thus uses a single glass material, fused silica.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible. Re-optimizing the design for higher NAs would generally limit the field size or bandwidth and may require slightly increased diameter objective elements. Thus the combination of performance characteristics or functionality for the present design is particularly noteworthy and has generally not been accomplished in known objective designs. Aspheric surfaces can be placed on other elements in the reduction lens group 201, focusing lens group 202, and catadioptric group 203 with the result of removing the need for the nose piece, improving design performance, or reducing manufacturing tolerances.

Using the design of FIG. 2 as a starting point, the design may be re-optimized for other wavelengths, NAs, field sizes, or performance requirements. This re-optimization can require a slight tuning or altering of components, and may generally be performed by those skilled in the art.

The design of FIG. 2 provides a relatively low intrinsic polychromatic wavefront aberration over the design bandwidth of 1 nm. The low wavefront aberration provides increased manufacturing headroom, or ease of manufacture, while enabling relatively high objective performance.

Figure 3:
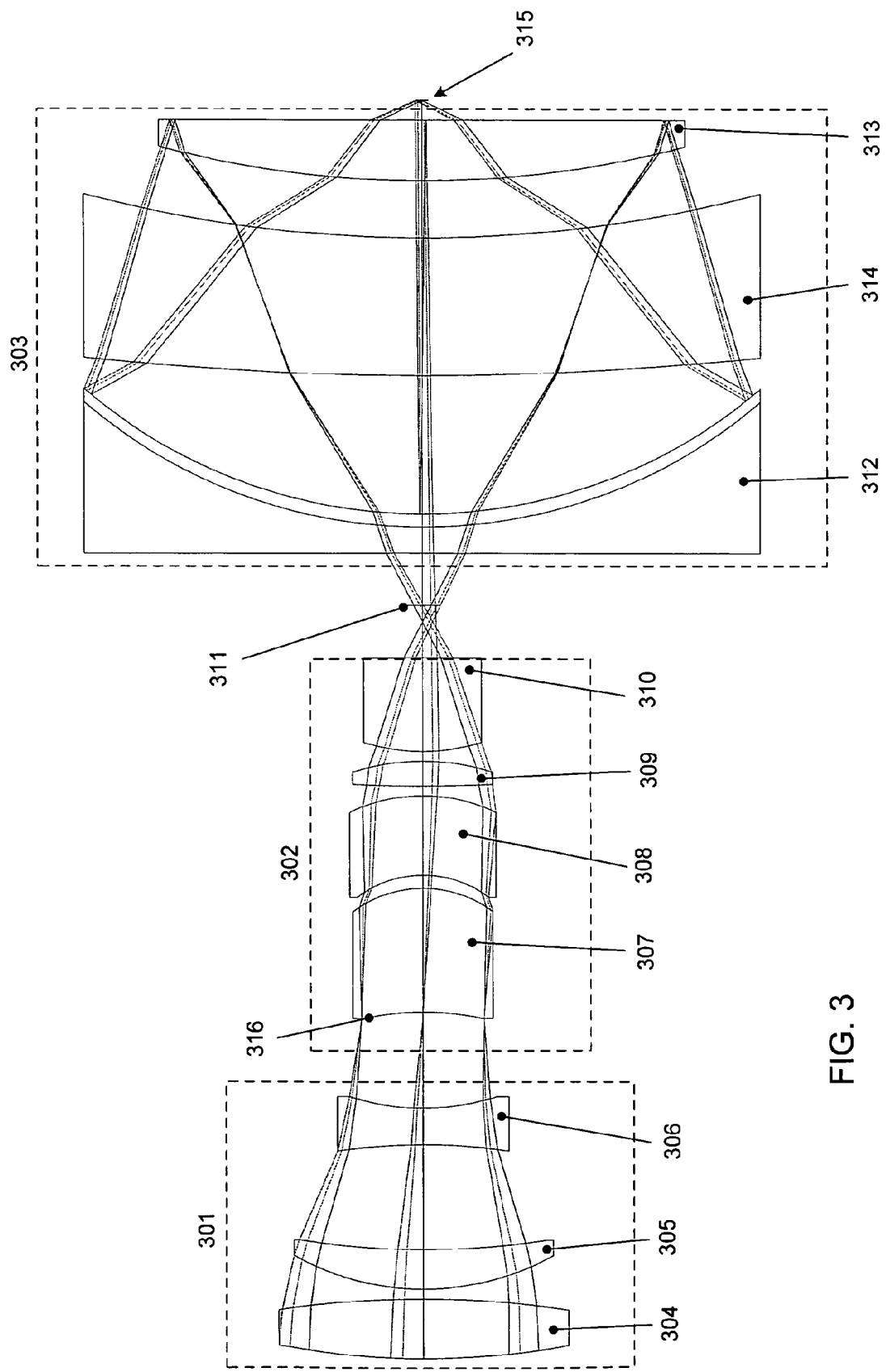
FIG. 3 is a catadioptric imaging system with a two surface Mangin element and 2.5 mm field suitable for use with external beam delivery using an aspheric surface on the first surface of one element.

FIG. 3 illustrates an alternate embodiment according to the present design. The design of FIG. 3 employs an aspheric surface to allow an extended working distance without use of a nosepiece. The design comprises a reduction lens group 301, a focusing lens group 302, and a catadioptric group 303. The reduction lens group 301 includes lenses 304-306, the field lens group 302 includes lenses 307-310, and the catadioptric group 303 includes elements 312-314. Light energy is received from the left side of FIG. 3 for brightfield type illumination. Reduction lens group 301 reduces the beam diameter and transfers light energy to focusing lens group 302. Focusing lens group 302 then forms intermediate image 311 in proximity to the vertex of Mangin element 312 in catadioptric group 303. The catadioptric group 303 comprises three elements including a mirror element 312, lens element 313 used in triple pass, and a Mangin element 314. The three element arrangement for the catadioptric group 303 places the lens 313 between the Mangin element 312 and Mangin element 314.

One aspect of this design that allows for external oblique illumination is Mangin element 314 spaced 4 mm from sample 315. This allows light to illuminate sample 315 by being introduced between the reflective surface of Mangin element 314 and sample 315. Introduction of light in this manner keeps high power illumination light outside the objective. Delivering the light to the sample can be accomplished in a similar manner to that described in the '998 patent application discussed herein.

As opposed to the three surface catadioptric element, the design of FIG. 3 uses aspheric surface on element 313 to correct aberrations due to the extended working distance of the objective. In this application the aspheric surface is on the surface of element 313 farthest from the sample 315.

Also, as compared to the three surface Mangin element approach, the diameter of the light on the element surfaces throughout the objective is significantly increased. Increased light diameter is particularly applicable for surfaces in proximity to the internal image 311, and is also true for the surface of Mangin element 314 closest to the sample 315. Increased light diameter tends to reduce the potential for optical damage on these surfaces and tends to reduce potential photocontamination. Angles of incidence provided tend to reduce ghost reflections and stray light that can limit the performance of dark-field systems, particularly with systems exhibiting large field angles.

Element thicknesses and positions also limit coherent interference when using a modelocked laser as an illumination source as described herein.

The design approach of FIG. 3 has an increased central obscuration relative to the diameter of the spherical mirror 312 when compared to the three surface Mangin element design approach employed in the '998 patent application. The central obscuration of the design in FIG. 3 is approximately 21% of the diameter. The central obscuration for the aspheric design can be reduced if the elements in the catadioptric group increase in diameter. Such a reduction in central obscuration and the associated tradeoff can be made by those skilled in the art using the design of FIG. 3 as a starting point.

Table 5 presents the lens prescriptions for the embodiment illustrated in FIG. 3.

TABLE 5

Lens Prescriptions for the design of FIG. 3

| Surf | Radius | Thickness | Glass | Diameter |
| --- | --- | --- | --- | --- |
| OBJ | Infinity | Infinity | | 0.000 |
| 1 | 165.726 | 12.000 | Fused silica | 57.691 |
| 2 | −181.346 | 2.000 | | 56.361 |
| 3 | 52.729 | 8.000 | Fused silica | 51.483 |
| 4 | 167.149 | 21.047 | | 49.425 |
| 5 | −120.539 | 7.413 | Fused silica | 34.011 |
| 6 | 47.291 | 19.380 | | 29.300 |
| STO | −57.776 | 0.000 | | 24.203 |
| 8 | −57.776 | 25.000 | Fused silica | 24.203 |
| 9 | −22.848 | 2.664 | | 27.774 |
| 10 | −21.223 | 16.088 | Fused silica | 26.031 |
| 11 | −32.850 | 2.000 | | 29.002 |
| 12 | 295.162 | 5.030 | Fused silica | 27.657 |

TABLE 5-continued

Lens Prescriptions for the design of FIG. 3

| Surf | Radius | Thickness | Glass | Diameter |
|---|---|---|---|---|
| 13 | −44.382 | 2.000 | | 27.172 |
| 14 | 39.286 | 18.854 | Fused silica | 23.254 |
| 15 | −190.003 | 10.594 | | 12.208 |
| 16 | Infinity | 10.594 | | 7.228 |
| 17 | −1000.000 | 8.000 | Fused silica | 17.063 |
| 18 | 100.968 | 28.000 | | 134.000 |
| 19 | 580.105 | 28.000 | Fused silica | 134.000 |
| 20 | 255.848 | 11.541 | | 134.000 |
| 21 | 199.733 | 12.250 | Fused silica | 104.000 |
| 22 | Infinity | −12.250 | MIRROR | 104.000 |
| 23 | 199.733 | −11.541 | | 104.000 |
| 24 | 255.848 | −28.000 | Fused silica | 134.000 |
| 25 | 580.105 | −28.000 | | 134.000 |
| 26 | 100.968 | 28.000 | MIRROR | 134.000 |
| 27 | 580.105 | 28.000 | Fused silica | 134.000 |
| 28 | 255.848 | 11.541 | | 134.000 |
| 29 | 199.733 | 12.250 | Fused silica | 104.000 |
| 30 | Infinity | 4.000 | | 104.000 |
| IMA | Infinity | | | 2.504 |

For the design shown in FIG. 3, Table 6 lists the parameters for the aspheric surface. The definitions of these parameters are as in the previous embodiment. The aspheric surface of element 313 is listed in table 5 as surface 19, surface 25, and surface 27. The side of an element has one surface entry in the table for each time light interacts with that surface.

TABLE 6

Aspheric surface parameters for the lens prescription in Table 5.

| | Surf 19, 25, 27 |
|---|---|
| Conic constant (k) | 0 |
| Maximum half diameter (r) mm | 70 |
| Curvature (c) 1/mm | 0.0017238 |
| $\alpha_1$ | 0.14637585 |
| $\alpha_2$ | −0.50850659 |
| $\alpha_3$ | 0.19370527 |
| $\alpha_4$ | 0.20910877 |
| $\alpha_5$ | −0.7682863 |
| $\alpha_6$ | 0.5628124 |
| $\alpha_7$ | −0.070419853 |
| $\alpha_8$ | 0.5445515 |
| $\alpha_9$ | −1.1466281 |
| $\alpha_{10}$ | 0.50905732 |

In the design of FIG. 3, the numerical aperture may approach or even exceed approximately 0.9 in air. From FIG. 3, the reducing lens group has the ability to receive light energy and transmit light energy to the objective pupil location 316. The focusing lens group 302 has the ability to receive light energy and transmit focused light energy and form intermediate image 311. The catadioptric group or Mangin mirror arrangement 303 receives the intermediate energy and provides controlled light energy to the specimen 315.

Alternately, the reflected path originates at the specimen, and light scattered or reflected from the specimen is received by the catadioptric group or Mangin mirror arrangement 303 and forms and transmits reflected light energy. The focusing lens group 302 receives resultant light energy and transmits light energy to an aperture stop 316. An aperture or mask can be placed at the aperture stop 316 to limit or modify the NA of the objective. In addition, a central obscuration may be placed at the surface located at aperture stop 316 that matches the central obscuration in the catadioptric group 303. Such a central obscuration can help limit stray light reaching any detection system.

The design of FIG. 3 operates in the presence of light energy at a 266 nm wavelength with a 1 nm bandwidth and exhibits a field size of approximately 2.5 mm. Field size represents the size of the area on the specimen that can be imaged by the system with minimum degradation in optical performance. The design of FIG. 3 has a polychromatic Strehl Ratio of better than 0.99 across the field. Further correction of residual aberrations using additional imaging optics is also possible, where further correction can increase the optical specifications, including but not limited to bandwidth or field size. The maximum element diameter for the embodiment illustrated in FIG. 3 is approximately 134 mm. The design of FIG. 3 is self corrected as described herein. The design presented in FIG. 3 and Table 5 thus uses a single glass material, fused silica.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible. Re-optimizing the design for higher NAs would generally limit the field size or bandwidth and may require slightly increased diameter objective elements.

Thus it should be appreciated that the combination of performance characteristics for the present design is particularly noteworthy and has generally not been accomplished in known objective designs. Aspheric surfaces can be placed on or in place of other elements in the reduction lens group 301, focusing lens group 302, and catadioptric group 303 with the result of removing the nose piece, improving the design performance, or reducing the manufacturing tolerances. Using this design as a starting point, the design may be re-optimized for other wavelengths, NAs, field sizes, or performance requirements. This re-optimization can require a slight tuning or altering of components, and may generally be within the abilities of those skilled in the art.

The design of FIG. 3 provides a relatively low intrinsic polychromatic wavefront aberration over the design bandwidth of 1 nm. The low wavefront aberration provides increased manufacturing headroom, or ease of manufacture, while enabling relatively high performance of the manufactured objective.

Figure 4:
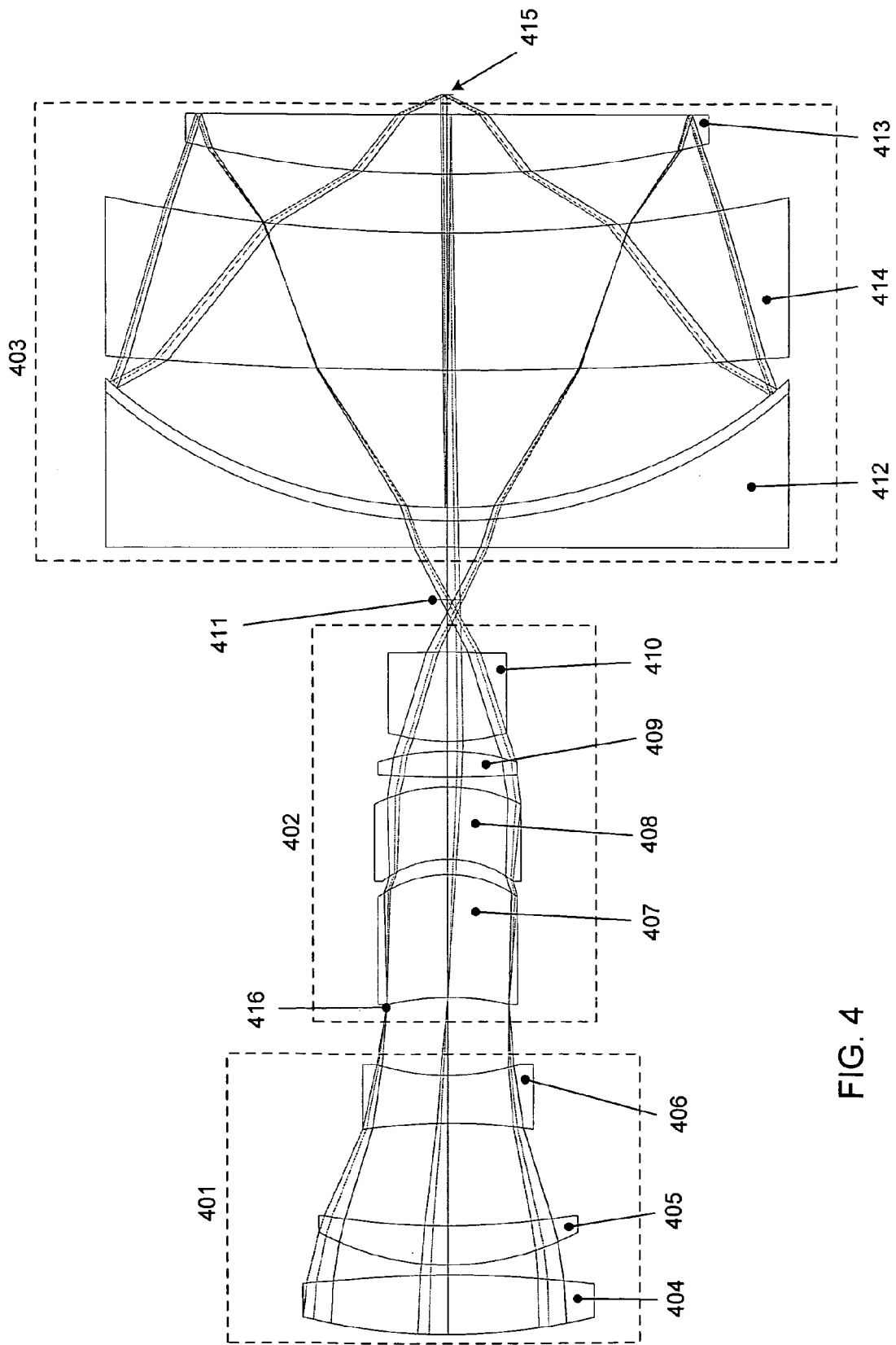
FIG. 4 is a catadioptric imaging system with a two surface Mangin element and 2.5 mm field suitable for use with external beam delivery using an aspheric surface on the mirror element.

FIG. 4 illustrates an alternate embodiment according to the present design. This design uses an aspheric surface to allow an extended working distance without using a nosepiece. The design comprises a reduction lens group 401, a focusing lens group 402, and a catadioptric group 403. The reduction lens group 401 includes lenses 404-406, the field lens group 402 includes lenses 407-410, and the catadioptric group 403 includes elements 412-414. Light energy is received from the left side of FIG. 4 for brightfield type illumination. Reduction lens group 401 reduces the beam diameter and transfers light energy to focusing lens group 402. Focusing lens group 402 then forms intermediate image 411 in proximity to the vertex of Mangin element 412 in catadioptric group 403. The catadioptric group 403 comprises three elements including a mirror element 412, lens element 413 used in triple pass, and a Mangin element 414. The three element arrangement for the catadioptric group 403 places the lens 413 between the Mangin element 412 and Mangin element 414.

One aspect of this design that allows for external oblique illumination is Mangin element 414 spaced 4 mm from sample 415. External illumination allows light to illuminate sample 415 by the light being introduced between the reflective surface of Mangin element 414 and sample 415. Introducing light in this manner keeps high power illumination light outside the objective. Delivering the light to the sample can be accomplished in a manner similar to that described in the '998 patent application discussed herein.

Compared to the design of the '998 patent application utilizing the three surface catadioptric element, the design of FIG. 4 uses an aspheric surface on element 412 to correct aberrations due to the extended working distance of the objective. In this application the aspheric surface is on the reflective surface of element 412.

The embodiment of FIG. 4 provides advantages when compared to the three surface Mangin element approach. Again, diameter of light on the element surfaces throughout the objective is significantly increased, especially for surfaces in proximity to the internal image 411. Increased light diameter also occurs for the surface of Mangin element 414 closest to the sample 415, and such an increase in light diameter tends to reduce the potential for optical damage on these surfaces as well as potential photocontamination. Angles of incidence are provided to reduce ghost reflections and stray light that can limit the performance of dark-field systems. Reduction of ghost reflections in this manner can be particularly useful for systems with large field angles.

Element thicknesses and positions are provided to limit coherent interference when using a modelocked laser as an illumination source as described herein.

The design approach of FIG. 4 provides an increased central obscuration relative to the diameter of the spherical mirror 412 when compared to the three surface Mangin element design approach used in the '998 patent application. The central obscuration of the design in FIG. 4 is 22% of the diameter, and central obscuration for the aspheric design can be reduced if the elements in the catadioptric group increase in diameter. Such a design tradeoff can be made by those skilled in the art using the FIG. 4 design as a starting point.

Table 7 presents the lens prescriptions for the embodiment illustrated in FIG. 4.

TABLE 7

Lens Prescriptions for the design of FIG. 4

| Surf | Radius | Thickness | Glass | Diameter |
|---|---|---|---|---|
| OBJ | Infinity | Infinity | | 0.000 |
| 1 | 133.057 | 12.000 | Fused silica | 58.157 |
| 2 | −211.852 | 2.000 | | 56.700 |
| 3 | 54.410 | 8.000 | Fused silica | 51.800 |
| 4 | 163.340 | 20.797 | | 49.593 |
| 5 | −126.150 | 9.715 | Fused silica | 34.394 |
| 6 | 47.836 | 15.700 | | 28.697 |
| STO | −54.348 | 0.000 | | 24.576 |
| 8 | −54.348 | 25.000 | Fused silica | 24.576 |
| 9 | −24.006 | 3.116 | | 28.110 |
| 10 | −21.602 | 14.650 | Fused silica | 26.397 |
| 11 | −32.696 | 2.000 | | 29.446 |
| 12 | 204.713 | 5.216 | Fused silica | 28.172 |
| 13 | −45.541 | 2.000 | | 27.688 |
| 14 | 42.374 | 18.251 | Fused silica | 23.815 |
| 15 | −118.144 | 10.651 | | 13.424 |
| 16 | Infinity | 10.651 | | 6.468 |
| 17 | −1000.000 | 8.000 | Fused silica | 16.464 |
| 18 | 100.926 | 28.000 | | 21.624 |
| 19 | 790.855 | 28.000 | Fused silica | 53.055 |
| 20 | 317.721 | 12.016 | | 73.581 |
| 21 | 215.502 | 12.250 | Fused silica | 95.647 |

TABLE 7-continued

Lens Prescriptions for the design of FIG. 4

| Surf | Radius | Thickness | Glass | Diameter |
|---|---|---|---|---|
| 22 | Infinity | −12.250 | MIRROR | 99.915 |
| 23 | 215.502 | −12.016 | | 103.597 |
| 24 | 317.721 | −28.000 | Fused silica | 112.706 |
| 25 | 790.855 | −28.000 | | 130.116 |
| 26 | 100.926 | 28.000 | MIRROR | 134.221 |
| 27 | 790.855 | 28.000 | Fused silica | 117.235 |
| 28 | 317.721 | 12.016 | | 73.095 |
| 29 | 215.502 | 12.250 | Fused silica | 37.867 |
| 30 | Infinity | 4.000 | | 20.352 |
| IMA | Infinity | | | 2.504 |

For the design shown in FIG. 4, Table 8 lists the parameters for the aspheric surface. The definitions of these parameters are as in the previous embodiment. The aspheric surface of element 412 is listed in table 7 as surface 18 and surface 26. The side of an element has one surface entry in the table for each time light interacts with that surface.

TABLE 8

Aspheric surface parameters for the lens prescription in Table 7.

| | Surf 18, 26 |
|---|---|
| Conic constant (k) | 0 |
| Maximum half diameter (r) mm | 68 |
| Curvature (c) 1/mm | 0.00990825 |
| $\alpha_1$ | 0 |
| $\alpha_2$ | −0.007635532 |
| $\alpha_3$ | 0.014072625 |
| $\alpha_4$ | 0.045356849 |
| $\alpha_5$ | −0.26984923 |
| $\alpha_6$ | 0.61505635 |
| $\alpha_7$ | −0.44914783 |
| $\alpha_8$ | −0.41714219 |
| $\alpha_9$ | 0.85252006 |
| $\alpha_{10}$ | −0.38900167 |

In the design presented in FIG. 4, the numerical aperture may approach or even exceed approximately 0.9 in air. From FIG. 4, the reducing lens group has the ability to receive light energy and transmit light energy to the objective pupil location 416. The focusing lens group 402 has the ability to receive light energy and transmit focused light energy and form intermediate image 411. The catadioptric group or Mangin mirror arrangement 403 receives the intermediate energy and provides controlled light energy to the specimen 415. Alternately, the reflected path originates at the specimen, and light scattered or reflected from the specimen is received by the catadioptric group or Mangin mirror arrangement 403 and forms and transmits reflected light energy. The focusing lens group 402 receives resultant light energy and transmits light energy to an aperture stop 416. An aperture or mask can be placed at the aperture stop 416 to limit or modify the NA of the objective. In addition, a central obscuration may be placed at the surface located at aperture stop 416 that matches the central obscuration in the catadioptric group 403. Such a central obscuration may limit stray light reaching a detection system.

The design of FIG. 4 operates in the presence of light energy at a 266 nm wavelength with a 1 nm bandwidth and exhibits a field size of approximately 2.5 mm. Again, field size represents the size of the area on the specimen that can be imaged by the system with minimum degradation in optical performance. The design of FIG. 4 has a polychromatic Strehl Ratio of better than 0.97 across the field. Further correction of residual aberrations using additional imaging optics is also possible, where further correction can increase the optical specifications, including but not limited to bandwidth or field size. The maximum element diameter for the embodiment illustrated in FIG. 4 is approximately 134 mm. The design of FIG. 4 is self corrected as described above. The design presented in FIG. 4 and Table 7 uses a single glass material, fused silica.

As is true with any optical design, certain tradeoffs may be made to improve performance characteristics depending on the desired application of the objective or optical design. One may, for example, sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible.

Re-optimizing the design for higher NAs would generally limit the field size or bandwidth and may require slightly increased diameter objective elements. Thus it should be appreciated that the combination of performance characteristics for the present design is particularly noteworthy and has generally not been accomplished in known objective designs. Aspheric surfaces can be placed on other elements in the reduction lens group 401, focusing lens group 402, and catadioptric group 403 with the result of removing the nose piece, improving the design performance, or reducing the manufacturing tolerances. Using this design as a starting point, the design may be re-optimized for other wavelengths, NAs, field sizes, or performance requirements. This re-optimization can require a slight tuning or altering of components, and may generally be within the abilities of those skilled in the art.

The design of FIG. 4 provides a relatively low intrinsic polychromatic wavefront aberration over the design bandwidth of 1 nm. The low wavefront aberration provides increased manufacturing headroom, or ease of manufacture, while enabling relatively high performance of the manufactured objective.

Figure 5:
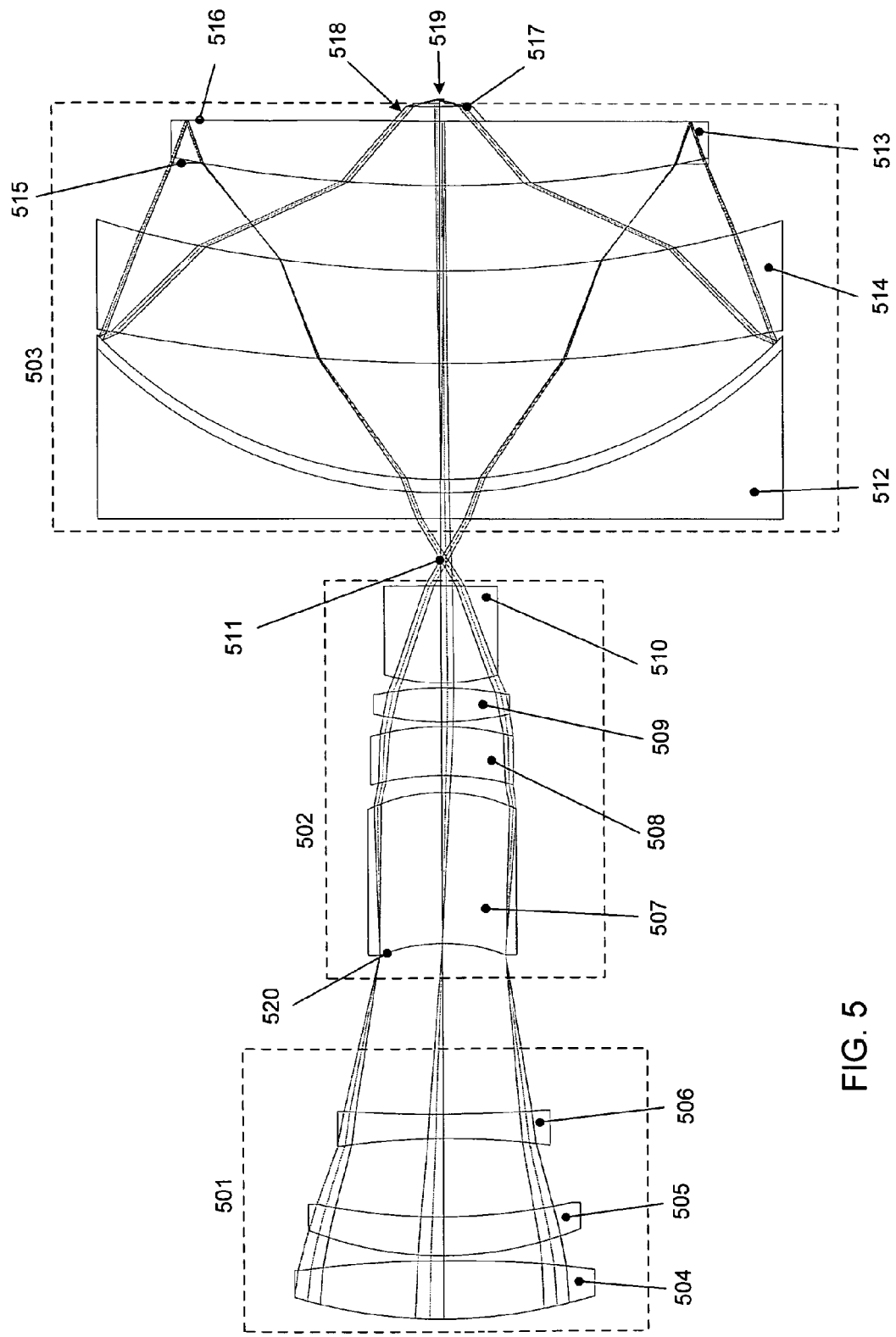
FIG. 5 is a catadioptric imaging system with a three surface Mangin element and 3.0 mm field suitable for use with external beam delivery using an aspheric surface providing improved NA performance.

FIG. 5 illustrates an alternate embodiment according to the present design. This design uses an aspheric surface to increase the NA of the objective. The design comprises a reduction lens group 501, a focusing lens group 502, and a catadioptric group 503. The reduction lens group 501 includes lenses 504-506, the field lens group 502 includes lenses 507-510, and the catadioptric group 503 includes elements 512-514. Light energy is received from the left side of FIG. 5 for brightfield type illumination. Reduction lens group 501 reduces the beam diameter and transfers light energy to focusing lens group 502. Focusing lens group 502 then forms intermediate image 511 in proximity to the vertex of Mangin element 512 in catadioptric group 503. The catadioptric group 503 comprises three elements including a mirror element 512, lens element 513 used in triple pass, and a three surface Mangin element 514 that includes an attached nosepiece 515. The three element arrangement for the catadioptric group 503 places the lens 513 between mirror element 512 and Mangin element 514.

One aspect of this FIG. 5 design is that the design allows for external oblique illumination using Mangin element 514 having three optical surfaces 515, 516, and 517 located at different axial positions. Compared to prior catadioptric systems, the glass on mangin element 514 closest to the specimen 519 extends from surface 516 to surface 517. Note that surface 516 includes at least one mirrored portion. This extension 518 may be a section of a conically shaped lens or glass piece that can be formed separately or integrally formed with mangin element 514. Construction of this extension is discussed below. The marginal ray angle is reduced because of the index of the glass, allowing for surface 516 to be recessed while minimizing the increase of the central obscuration. The additional space between surface 516 and the specimen or sample 519 allows for laser illumination. Such additional space keeps high power illumination light outside the objective. Delivering light to the sample can be accomplished in a similar manner to that described in the '998 patent application.

Element 514 can be produced using two primary methods. Element 514 can be constructed from a single piece of glass, grinding and polishing away the glass in the outer portion between surface 516 and surface 517. Optical surface 516 may then be polished without impact to surface 517. An alternate method that simplifies manufacturing is to manufacture two separate glass components. One component is the glass portion bounded by surface 515 and surface 516. The second component is the glass portion bounded by surface 516 and surface 517. Both components, namely the extension component 518 and element 514, can be attached by optical contacting, gluing, or mechanical mounting.

Compared to use of the three surface catadioptric element in the '998 application, the design of FIG. 5 uses an aspheric surface on element 513 to correct aberrations produced and increases the NA of the objective to 0.96. This also improves the performance of the objective for NAs below 0.96. In this application, the aspheric surface is the surface farthest from the sample 519 on element 513.

This design approach using 0.96 NA has an increased central obscuration relative to the diameter of the spherical mirror 512 when compared to the three surface Mangin element design approach using 0.9 NA. The central obscuration of the design in FIG. 5 is 20% of the diameter. Central obscuration for the high NA aspheric design using the three surface Mangin element can be reduced if the elements in the catadioptric group increase in diameter. Design tradeoffs can be made by those skilled in the art using the design of FIG. 5 as a starting point.

Table 9 presents the lens prescriptions for the embodiment illustrated in FIG. 5.

TABLE 9

Lens Prescriptions for the design of FIG. 5

| Surf | Radius | Thickness | Glass | Diameter |
|---|---|---|---|---|
| OBJ | Infinity | Infinity | | 0.000 |
| 1 | 104.863 | 12.000 | Fused silica | 60.582 |
| 2 | −221.337 | 1.000 | | 59.199 |
| 3 | 74.074 | 8.000 | Fused silica | 54.827 |
| 4 | 128.016 | 16.000 | | 51.520 |
| 5 | −149.012 | 5.000 | Fused silica | 42.946 |
| 6 | 295.936 | 35.000 | | 40.369 |
| STO | −34.321 | 0.000 | | 25.425 |
| 8 | −34.321 | 31.000 | Fused silica | 25.425 |
| 9 | −34.029 | 3.500 | | 30.042 |
| 10 | −54.076 | 10.000 | Fused silica | 28.688 |
| 11 | −53.003 | 1.000 | | 28.784 |
| 12 | 58.799 | 7.000 | Fused silica | 27.511 |
| 13 | −62.340 | 1.000 | | 26.144 |
| 14 | 41.489 | 20.000 | Fused silica | 22.941 |
| 15 | −191.406 | 13.851 | | 9.687 |
| 16 | −157.776 | 8.000 | Fused silica | 12.127 |
| 17 | 94.933 | 23.835 | | 138.000 |
| 18 | 350.133 | 19.117 | Fused silica | 138.000 |
| 19 | 230.399 | 17.574 | | 138.000 |
| 20 | 252.363 | 13.395 | Fused silica | 96.211 |
| 21 | Infinity | −13.395 | MIRROR | 108.000 |

TABLE 9-continued

Lens Prescriptions for the design of FIG. 5

| Surf | Radius | Thickness | Glass | Diameter |
|---|---|---|---|---|
| 22 | 252.363 | −17.574 | | 108.000 |
| 23 | 230.399 | −19.117 | Fused silica | 138.000 |
| 24 | 350.133 | −23.835 | | 138.000 |
| 25 | 94.933 | 23.835 | MIRROR | 138.000 |
| 26 | 350.133 | 19.117 | Fused silica | 138.000 |
| 27 | 230.399 | 17.574 | | 138.000 |
| 28 | 252.363 | 13.395 | Fused silica | 108.000 |
| 29 | Infinity | 3.044 | Fused silica | 18.611 |
| 30 | Infinity | 1.500 | | 13.468 |
| IMA | Infinity | | | 2.025 |

For the design shown in FIG. 5, Table 10 lists the parameters for the aspheric surface. The definitions of these parameters are as in the previous embodiments. The aspheric surface of element 513 is listed in Table 9 as surface 18, surface 24, and surface 26. The side of an element has one surface entry in the table for each time light interacts with that surface.

TABLE 10

Aspheric surface parameters for the lens prescription in Table 9.

| | Surf 18, 24, 26 |
|---|---|
| Conic constant (k) | 0 |
| Maximum half diameter (r) mm | 60 |
| Curvature (c) 1/mm | 0.002856 |
| $\alpha_1$ | 0.41908055 |
| $\alpha_2$ | −0.23761782 |
| $\alpha_3$ | −0.012339853 |
| $\alpha_4$ | 0.29742739 |
| $\alpha_5$ | −0.5881501 |
| $\alpha_6$ | 0.58110655 |
| $\alpha_7$ | −0.2802672 |
| $\alpha_8$ | 0.047467481 |
| $\alpha_9$ | 0 |
| $\alpha_{10}$ | 0 |

In the design presented in FIG. 5, the numerical aperture may approach or even exceed approximately 0.96 in air. From FIG. 5, the reducing lens group has the ability to receive light energy and transmit light energy to the objective pupil location 520. The focusing lens group 502 has the ability to receive light energy and transmit focused light energy and form intermediate image 511. The catadioptric group or Mangin mirror arrangement 503 receives the intermediate energy and provides controlled light energy to the specimen 515. Alternately, the reflected path originates at the specimen, and light scattered or reflected from the specimen is received by the catadioptric group or Mangin mirror arrangement 503 and forms and transmits reflected light energy. The focusing lens group 502 receives resultant light energy and transmits light energy to an aperture stop 520. An aperturte or mask can be placed at the aperture stop 520 to limit or modify the NA of the objective. In addition, a central obscuration may be placed at the surface located at aperture stop 520 that matches the central obscuration in the catadioptric group 503. Such central obscuration can help limit stray light reaching a detector or detection system.

The design of FIG. 5 operates in the presence of light energy at a 266 nm wavelength with a 1 nm bandwidth and exhibits a field size of approximately 3.0 mm. The design of FIG. 5 has a polychromatic Strehl Ratio of better than 0.95 across the field. Further correction of residual aberrations using additional imaging optics is also possible, where further correction can increase the optical specifications, including but not limited to bandwidth or field size. The maximum element diameter for the embodiment illustrated in FIG. 5 is approximately 138 mm. The design of FIG. 5 is self corrected as described in the first embodiment. The design presented in FIG. 5 and Table 9 thus uses a single glass material, fused silica.

Again, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. Optimizing for lower or higher NAs, for example, is possible. Reducing the NA can reduce the manufacturing tolerance and the outer diameter of the objective. Lower NA designs can provide larger field sizes and larger bandwidths. Lower NA designs with the same performance and less optical elements are also possible. Re-optimizing the design for higher NAs would generally limit the field size or bandwidth and may require slightly increased diameter objective elements. Thus it should be appreciated that the combination of performance characteristics for the present design is particularly noteworthy and has generally not been accomplished in known objective designs. Aspheric surfaces can be placed on other elements in the reduction lens group 501, focusing lens group 502, and catadioptric group 503 with the result of increasing the NA of the design, improving the design performance, or reducing the manufacturing tolerances. Using this design as a starting point, the design may be re-optimized for other wavelengths, NAs, field sizes, or performance requirements. This re-optimization can require a slight tuning or altering of components, and may generally be within the abilities of those skilled in the art.

The design of FIG. 5 provides a relatively low intrinsic polychromatic wavefront aberration over the design bandwidth of 1 nm. The low wavefront aberration provides increased manufacturing headroom, or ease of manufacture, while facilitating relatively high performance.

Figure 6:
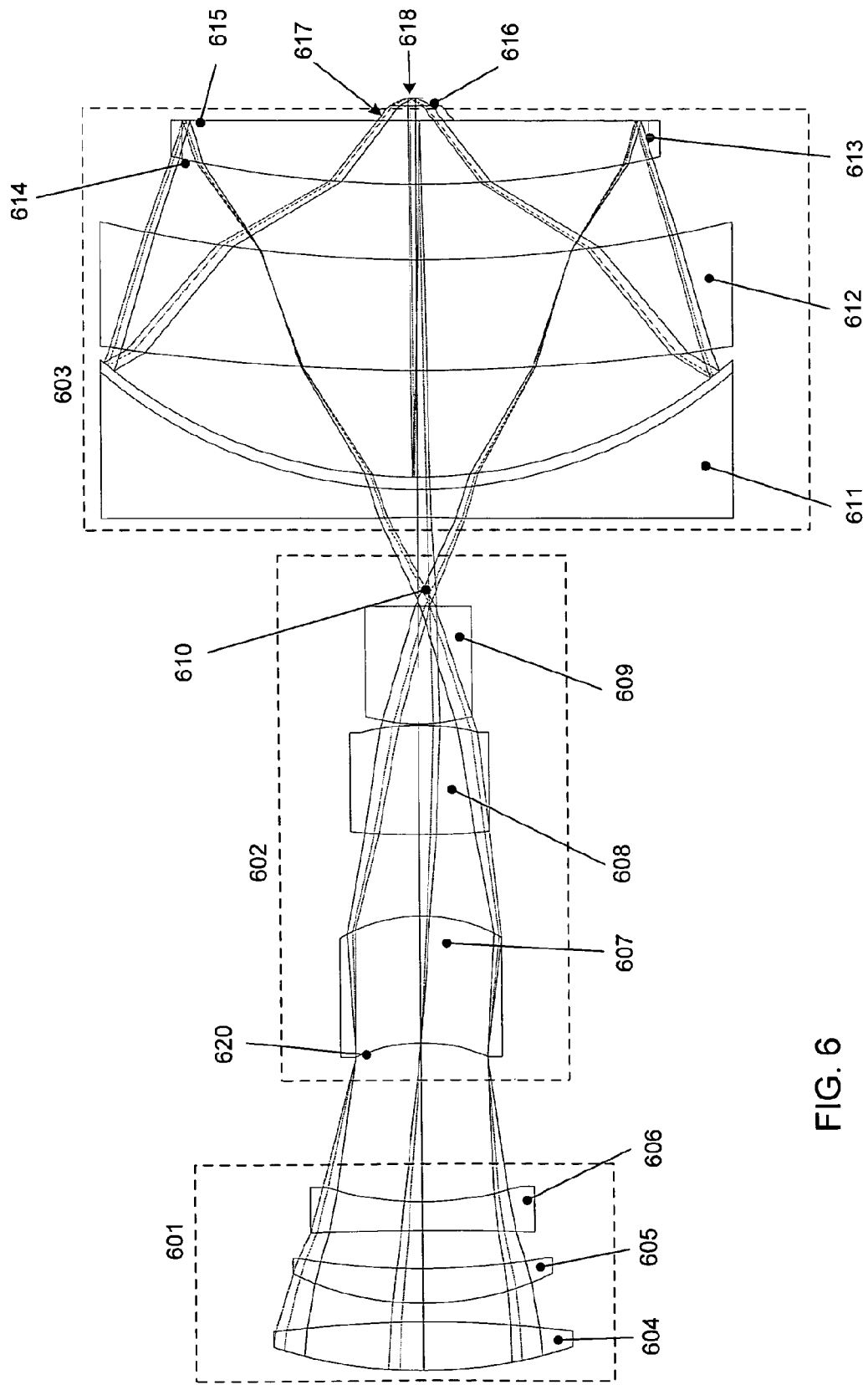
FIG. 6 is a catadioptric imaging system with a three surface Mangin element and 3.0 mm field suitable for use with external beam delivery using an aspheric surface to remove one lens.

FIG. 6 illustrates another embodiment according to the present design. This design uses an aspheric surface to allow a design with nine elements. The design comprises a reduction lens group 601, a focusing lens group 602, and a catadioptric group 603. The reduction lens group 601 includes lenses 604-606, the field lens group 602 includes lenses 607-609, and the catadioptric group 603 includes elements 611-613. Light energy is received from the left side of FIG. 6 for brightfield type illumination. Reduction lens group 601 reduces the beam diameter and transfers light energy to focusing lens group 602. Focusing lens group 602 then forms intermediate image 610 in proximity to the vertex of Mangin element 611 in catadioptric group 603. The catadioptric group 603 comprises three elements including a mirror element 611, lens element 612 used in triple pass, and a three surface Mangin element 613 that includes an attached nosepiece 617. The three element arrangement for the catadioptric group 603 places the lens 612 between mirror element 611 and Mangin element 613.

One aspect of this design that allows for external oblique illumination is Mangin element 613 that has three optical surfaces 614, 615, and 616 located at different axial positions. Compared to prior catadioptric systems, the glass on this mangin element 613 closest to the specimen 618 has been extended from surface 615 to surface 616. Note that surface 615 includes at least one mirrored portion. This extension 617 may be a section of a conically shaped lens or glass piece that can be formed separately or integrally formed with Mangin element 613. The manufacture of element 613 can be achieved as described in the previous embodiment.

The marginal ray angle is reduced because of the index of the glass, allowing for surface 516 to be recessed while minimizing the increase of the central obscuration. The additional space between surface 615 and sample 618 allows for laser illumination. This keeps high power illumination light completely outside the objective. Light delivery to the sample can be accomplished in a similar manner to that described in the '998 patent application.

Compared to the previous use of the three surface catadioptric element, the design of FIG. 6 uses an aspheric surface on element 612 to correct aberrations produced by removing a lens element from the focusing lens group 602. In this application the aspheric surface is the surface farthest from the sample 618 on element 612.

Table 11 presents the lens prescriptions for the embodiment illustrated in FIG. 6.

TABLE 11

Lens Prescriptions for the design of FIG. 6

| Surf | Radius | Thickness | Glass | Diameter |
|---|---|---|---|---|
| OBJ | Infinity | Infinity | | 0.000 |
| 1 | 90.223 | 9.551 | Fused silica | 58.054 |
| 2 | −243.955 | 3.663 | | 57.127 |
| 3 | 55.261 | 6.873 | Fused silica | 50.339 |
| 4 | 132.001 | 7.532 | | 48.128 |
| 5 | −791.403 | 5.607 | Fused silica | 43.447 |
| 6 | 60.434 | 31.272 | | 38.348 |
| STO | −30.130 | 0.000 | | 25.320 |
| 8 | −30.130 | 25.002 | Fused silica | 25.320 |
| 9 | −30.649 | 15.965 | | 31.208 |
| 10 | 117.912 | 21.747 | Fused silica | 26.744 |
| 11 | −43.272 | 0.200 | | 22.497 |
| 12 | 35.332 | 23.165 | Fused silica | 20.431 |
| 13 | −210.195 | 17.605 | | 6.757 |
| 14 | −167.178 | 8.000 | Fused silica | 18.394 |
| 15 | 91.995 | 21.100 | | 122.000 |
| 16 | 420.872 | 21.910 | Fused silica | 122.000 |
| 17 | 251.502 | 14.919 | | 122.000 |
| 18 | 206.164 | 12.523 | Fused silica | 90.000 |
| 19 | Infinity | −12.523 | MIRROR | 90.000 |
| 20 | 206.164 | −14.919 | | 94.327 |
| 21 | 251.502 | −21.910 | Fused silica | 122.000 |
| 22 | 420.872 | −21.100 | | 122.000 |
| 23 | 91.995 | 21.100 | MIRROR | 122.000 |
| 24 | 420.872 | 21.910 | Fused silica | 122.000 |
| 25 | 251.502 | 14.919 | | 122.000 |
| 26 | 206.164 | 12.523 | Fused silica | 90.000 |
| 27 | Infinity | 3.044 | Fused silica | 14.801 |
| 28 | Infinity | 1.500 | | 10.070 |
| IMA | Infinity | | | 3.009 |

For the design shown in FIG. 6, Table 12 lists the parameters for the aspheric surface. The definitions of these parameters are as in the previous embodiment. The aspheric surface of element 612 is listed in table 11 as surface 16, surface 22, and surface 24. The side of an element has one surface entry in the table for each time light interacts with that surface.

TABLE 12

Aspheric surface parameters for the lens prescription in Table 11.

| | Surf 16, 22, 24 |
|---|---|
| Conic constant (k) | 0 |
| Maximum half diameter (r) mm | 60 |
| Curvature (c) 1/mm | 0.002376 |
| $\alpha_1$ | 0.510416 |
| $\alpha_2$ | −0.35873 |

TABLE 12-continued

Aspheric surface parameters for the lens prescription in Table 11.

| | Surf 16, 22, 24 |
|---|---|
| $\alpha_3$ | 0.198836 |
| $\alpha_4$ | −0.27961 |
| $\alpha_5$ | 0.569883 |
| $\alpha_6$ | −0.76439 |
| $\alpha_7$ | 0.561646 |
| $\alpha_8$ | −0.18024 |
| $\alpha_9$ | 0 |
| $\alpha_{10}$ | 0 |

In the design presented in FIG. 6, the numerical aperture may approach or even exceed approximately 0.9 in air. From FIG. 6, the reducing lens group has the ability to receive light energy and transmit light energy to the objective pupil location 619. The focusing lens group 602 has the ability to receive light energy and transmit focused light energy and form intermediate image 610. The catadioptric group or Mangin mirror arrangement 603 receives the intermediate energy and provides controlled light energy to the specimen 618. Alternately, the reflected path originates at the specimen, and light scattered or reflected from the specimen is received by the catadioptric group or Mangin mirror arrangement 603 and forms and transmits reflected light energy. The focusing lens group 602 receives resultant light energy and transmits light energy to an aperture stop 619. An aperture or mask can be placed at the aperture stop 619 to limit or modify the NA of the objective. In addition, a central obscuration may be placed at the surface located at aperture stop 619 that matches the central obscuration in the catadioptric group 603. This can help keep stray light from reaching a detection system or detector.

The design of FIG. 6 operates in the presence of light energy at a 266 nm wavelength with a 1 nm bandwidth and exhibits a field size of approximately 3.0 mm. The design of FIG. 6 has a polychromatic Strehl Ratio of better than 0.97 across the field. Further correction of residual aberrations using additional imaging optics is also possible, where further correction can increase the optical specifications, including but not limited to bandwidth or field size. The maximum element diameter for the embodiment illustrated in FIG. 6 is approximately 122 mm. The design of FIG. 6 is self corrected, and the design presented in FIG. 6 and Table 11 uses a single glass material, fused silica.

Certain tradeoffs may be made to improve performance characteristics depending on the desired application of the objective or optical design. For example, bandwidth, field size, numerical aperture, and/or objective size may be sacrificed to enhance one of the aforementioned performance characteristics, depending on the application. Optimizing for lower or higher NAs is possible, where reducing the NA can reduce the manufacturing tolerance and the outer diameter of the objective. Lower NA designs can provide larger field sizes and larger bandwidths. Lower NA designs with the same performance and fewer optical elements are also possible. Re-optimizing the design for higher NAs would generally limit the field size or bandwidth and may require slightly increased diameter objective elements. Thus it should be appreciated that the combination of performance characteristics for the present design is particularly noteworthy and has generally not been accomplished in known objective designs.

Aspheric surfaces can be placed on other elements in the reduction lens group 601, focusing lens group 602, and catadioptric group 603 with the result of reducing the number of elements on the design, improving the design performance, or reducing the manufacturing tolerances. Using this design as a starting point, the design may be re-optimized for other wavelengths, NAs, field sizes, or performance requirements. This re-optimization can require a slight tuning or altering of components, and may generally be within the abilities of those skilled in the art while still within the teachings of the present invention.

The design of FIG. 6 provides a relatively low intrinsic polychromatic wavefront aberration over the design bandwidth of 1 nm. The low wavefront aberration provides increased manufacturing headroom, or ease of manufacture, while enabling relatively high performance of the manufactured objective.

Figure 7:
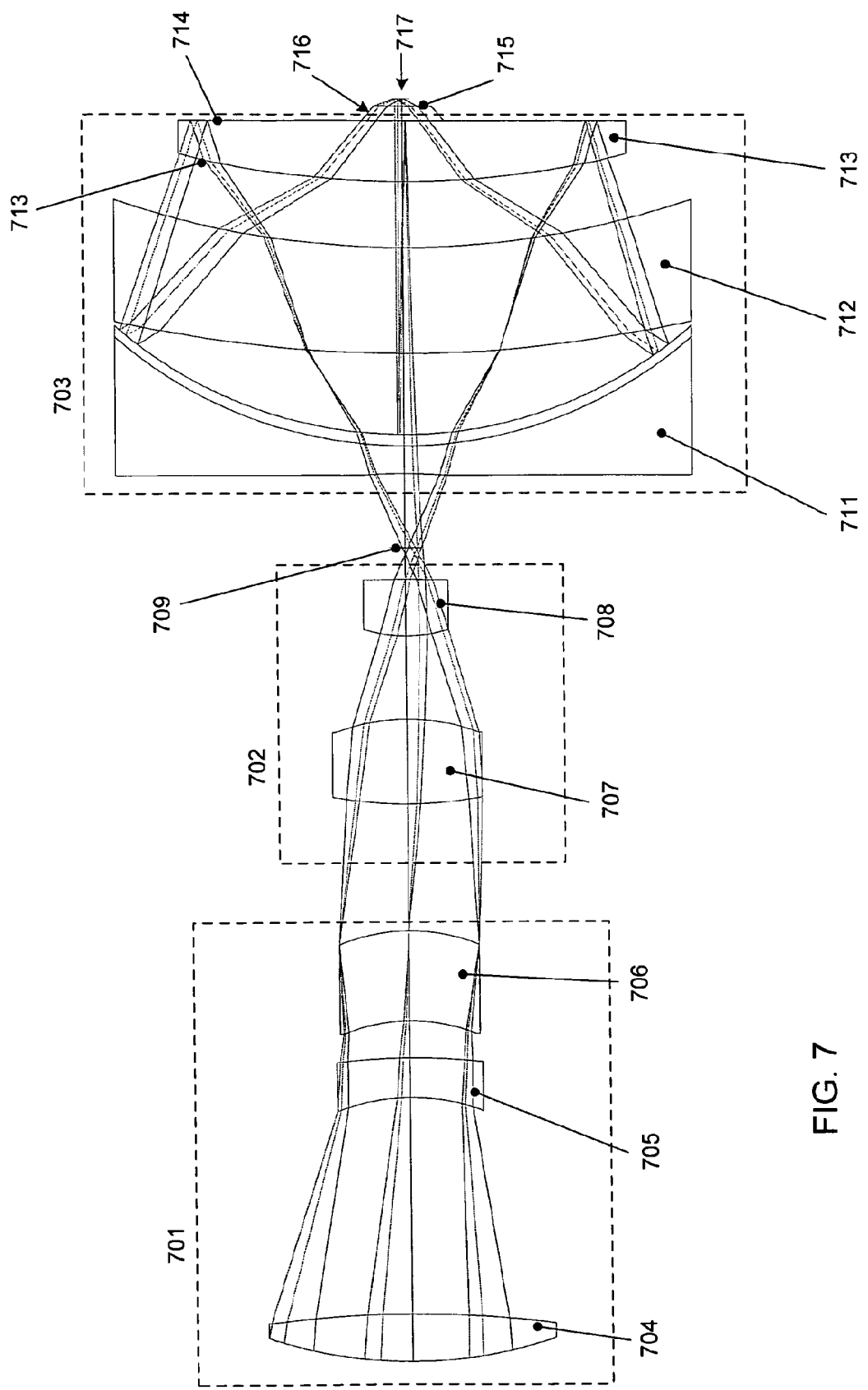
FIG. 7 is a catadioptric imaging system with a three surface Mangin element and 3.0 mm field suitable for use with external beam delivery using an aspheric surface to remove two lenses.

FIG. 7 illustrates a further embodiment according to the present design. The design of FIG. 7 uses an aspheric surface and includes only eight elements. The design includes a reduction lens group 701, a focusing lens group 702, and a catadioptric group 703. The reduction lens group 701 includes lenses 704-706, the field lens group 702 includes lenses 707 and 708, and the catadioptric group 703 includes elements 710-712. Light energy is received from the left side of FIG. 7 for brightfield type illumination. Reduction lens group 701 reduces the beam diameter and transfers light energy to focusing lens group 702. Focusing lens group 702 then forms intermediate image 709 in proximity to the vertex of Mangin element 710 in catadioptric group 703. The catadioptric group 703 includes three elements: mirror element 710, lens element 711 used in triple pass, and a three surface Mangin element 712 that includes an attached nosepiece 716. The three element arrangement for the catadioptric group 703 places the lens 711 between mirror element 710 and Mangin element 712.

Mangin element 712, having has three optical surfaces 713, 714, and 715 located at different axial positions, allows for external oblique illumination. Compared to prior catadioptric systems, the glass on Mangin element 712 closest to the specimen 717 has been extended from surface 714 to surface 715. Note that surface 714 includes at least one mirrored portion. This extension 716 may be a section of a conically shaped lens or glass piece formed separately or integrally formed with Mangin element 712, and element 712 can be manufactured as described with respect to the embodiment of FIG. 6.

Marginal ray angle of the objective is reduced because of the index of the glass, allowing for surface 714 to be recessed while minimizing the amount of the central obscuration. The additional space between surface 714 and sample 717 allows for laser illumination, thus keeping high power illumination light outside the objective. Delivering the light to the sample can be accomplished in a similar manner to that described in the '998 application.

Compared to the previous patent application utilizing the three surface catadioptric element, this design uses an aspheric surface on element 711 to correct aberrations produced by removing two lens elements from the focusing lens group 702. In this application the aspheric surface is the surface farthest from the sample 717 on element 711.

Table 13 presents lens prescriptions for the embodiment illustrated in FIG. 7.

TABLE 13

Lens Prescriptions for the design of FIG. 7

| Surf | Radius | Thickness | Glass | Diameter |
|---|---|---|---|---|
| OBJ | Infinity | Infinity | | 0.000 |
| 1 | 87.628 | 9.737 | Fused silica | 58.153 |

TABLE 13-continued

Lens Prescriptions for the design of FIG. 7

| Surf | Radius | Thickness | Glass | Diameter |
|---|---|---|---|---|
| 2 | −231.581 | 44.469 | | 57.194 |
| 3 | −40.763 | 8.115 | Fused silica | 29.614 |
| 4 | −132.034 | 7.569 | | 28.391 |
| 5 | −35.133 | 0.000 | | 26.719 |
| 6 | −35.133 | 18.439 | Fused silica | 26.719 |
| STO | −37.221 | 26.123 | | 28.284 |
| 8 | 80.716 | 17.410 | Fused silica | 30.292 |
| 9 | −39.896 | 17.174 | | 29.194 |
| 10 | 27.470 | 11.716 | Fused silica | 17.099 |
| 11 | −101.799 | 6.465 | | 11.013 |
| 12 | Infinity | 15.261 | | 6.599 |
| 13 | −109.434 | 8.000 | Fused silica | 17.275 |
| 14 | 85.543 | 16.773 | | 116.000 |
| 15 | 269.107 | 21.828 | Fused silica | 116.000 |
| 16 | 172.682 | 13.683 | | 116.000 |
| 17 | 179.833 | 12.694 | Fused silica | 90.000 |
| 18 | Infinity | −12.694 | MIRROR | 90.000 |
| 19 | 179.833 | −13.683 | | 90.000 |
| 20 | 172.682 | −21.828 | Fused silica | 116.000 |
| 21 | 269.107 | −16.773 | | 116.000 |
| 22 | 85.543 | 16.773 | MIRROR | 116.000 |
| 23 | 269.107 | 21.828 | Fused silica | 116.000 |
| 24 | 172.682 | 13.683 | | 116.000 |
| 25 | 179.833 | 12.694 | Fused silica | 90.000 |
| 26 | Infinity | 3.044 | Fused silica | 90.000 |
| 27 | Infinity | 1.500 | | 11.621 |
| IMA | Infinity | | | 3.003 |

For the design shown in FIG. 7, Table 14 lists the parameters for the aspheric surface. The definitions of these parameters are as in the previous embodiment. The aspheric surface of element 711 is listed in table 13 as surface 15, surface 21, and surface 23. The side of an element has one surface entry in the table for each time light interacts with the surface.

TABLE 14

Aspheric surface parameters for the lens prescription in Table 13.

| | Surf 15, 21, 23 |
|---|---|
| Conic constant (k) | 0 |
| Maximum half diameter (r) mm | 60 |
| Curvature (c) 1/mm | 0.00371599 |
| $\alpha_1$ | 0.89383791 |
| $\alpha_2$ | −0.61676302 |
| $\alpha_3$ | 0.14335623 |
| $\alpha_4$ | −0.14159016 |
| $\alpha_5$ | 0.29710964 |
| $\alpha_6$ | −0.61513451 |
| $\alpha_7$ | 0.62806026 |
| $\alpha_8$ | −0.28674653 |
| $\alpha_9$ | 0 |
| $\alpha_{10}$ | 0 |

In the design presented in FIG. 7, the numerical aperture may approach or even exceed approximately 0.9 in air. From FIG. 7, the reducing lens group has the ability to receive light energy and transmit light energy to the objective pupil location 718. The focusing lens group 702 has the ability to receive light energy and transmit focused light energy and form intermediate image 709. The catadioptric group or Mangin mirror arrangement 703 receives the intermediate energy and provides controlled light energy to the specimen 717. Alternately, the reflected path originates at the specimen, and light scattered or reflected from the specimen is received by the catadioptric group or Mangin mirror arrangement 703 and forms and transmits reflected light energy. The focusing lens group 702 receives resultant light energy and transmits light energy to an aperture stop 718. An aperture or mask can be placed at the aperture stop 718 to limit or modify the NA of the objective. In addition, a central obscuration may be placed at the surface located at aperture stop 718 that matches the central obscuration in the catadioptric group 703, and can help limit stray light reaching a detector or detection system.

The design of FIG. 7 operates in the presence of light energy at a 266 nm wavelength with a 1 nm bandwidth and exhibits a field size of approximately 3.0 mm. Field size in this arrangement represents the size of the area on the specimen that can be imaged by the system with minimum degradation in optical performance. The design of FIG. 7 has a polychromatic Strehl Ratio of better than 0.9 across the field. Further correction of residual aberrations using additional imaging optics is also possible, where further correction can increase the optical specifications, such as bandwidth or field size. The maximum element diameter for the embodiment illustrated in FIG. 7 is approximately 116 mm. The design of FIG. 7 is self corrected and uses a single glass material, fused silica.

Tradeoffs may be made to improve performance characteristics depending on the desired application of the objective or optical design, including but not limited to adversely affecting bandwidth, field size, numerical aperture, and/or objective size to enhance another of these performance characteristics, depending on the application. For example, optimizing for lower or higher NAs is possible, and reducing the NA can reduce the manufacturing tolerance and the outer diameter of the objective. Lower NA designs can provide larger field sizes and larger bandwidths. Lower NA designs with the same performance and less optical elements are also possible. Re-optimizing the design for higher NAs would generally limit the field size or bandwidth and may require slightly increased diameter objective elements. Thus the combination of performance characteristics for the present design is particularly noteworthy and has generally not been accomplished in known objective designs. Aspheric surfaces can be employed with other elements in the reduction lens group 701, focusing lens group 702, and catadioptric group 703 with the result of reducing the number of elements on the design, improving the design performance, or reducing the manufacturing tolerances. Using this design as a starting point, the design may be re-optimized for other wavelengths, NAs, field sizes, or performance requirements. This re-optimization can require a slight tuning or altering of components, generally within the abilities of those skilled in the art.

The design of FIG. 7 provides a relatively low intrinsic polychromatic wavefront aberration over the design bandwidth of 1 nm. The low wavefront aberration provides increased manufacturing headroom, or ease of manufacture, while enabling relatively high performance of the manufactured objective.

Figure 8:
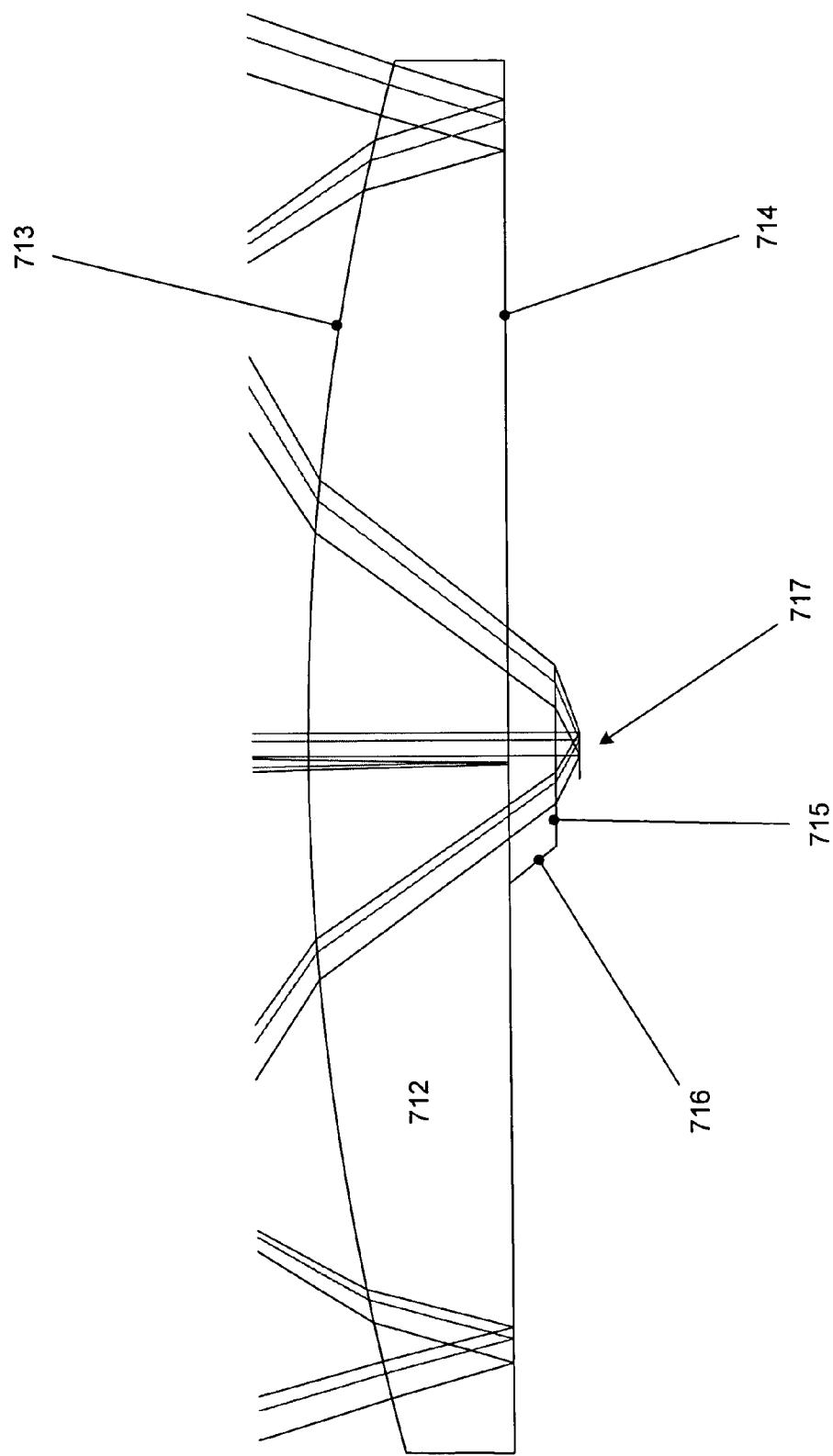
FIG. 8 illustrates a close view of the Mangin element of FIG. 7 highlighting the extension employed with the Mangin element.

FIG. 8 illustrates a close view of Mangin element 712 of FIG. 7 highlighting the extension 716 employed with or as part of the Mangin element 712. From FIG. 8, surface 715 is illustrated in addition to surface 714, closest to the specimen 717, and surface 713 away from the specimen. Use of the extension provides the beneficial aspects described herein.

The design presented herein and the specific aspects illustrated are meant not to be limiting, but may include alternate components while still incorporating the teachings and benefits of the invention. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An objective configured to inspect a specimen comprising:
    an outer element furthest from the specimen and comprising an outer element partial reflective surface oriented toward the specimen and configured to reflect light energy toward the specimen;
    an inner element nearest the specimen comprising an inner element partial reflective surface located proximate to and oriented away from the specimen, causing light energy to be reflected away from the specimen; and
    a central element positioned between the outer element and the inner element;
    wherein one of the outer element and central element comprises an aspheric surface, and further wherein the inner element is spatially configured to facilitate dark-field inspection of the specimen.

2. The objective of claim 1, wherein the objective supports light energy having a bandwidth in excess of at least 0.25 nm.

3. The objective of claim 1, further comprising a pupil aperture configured to be employed during dark-field inspection.

4. The objective of claim 1, further comprising a detector configured to accommodate high dynamic range signals produced by dark-field inspection.

5. The objective of claim 1, wherein the inner element comprises a Mangin element, and the aspheric surface is the surface of the Mangin element.

6. The objective of claim 1, wherein the central element comprises a lens, and the aspheric surface is the surface of the lens.

7. The objective of claim 1, wherein the aspheric surface is the outer element partial reflective surface.

8. The objective of claim 1, wherein the objective provides a field size in excess of at least 1.0 mm.

9. The objective of claim 1, wherein the objective provides a corrected bandwidth of at least 0.25 nm.

10. The objective of claim 1, wherein the objective provides a polychromatic Strehl ratio of greater than 0.9 across the field.

11. The objective of claim 1, wherein the objective is made from a single glass material.

12. The objective of claim 1, wherein the objective is configured to be employed with a laser beam delivery system external to the objective and in proximity to the Mangin element and deliver a laser beam to the specimen.

13. An objective configured to inspect a specimen, comprising:
    a Mangin element comprising a reflective surface positioned substantially proximate the specimen in an orientation causing light energy to reflect away from the specimen;
    a catadioptric element comprising a substantially curved reflective surface positioned to reflect light energy toward the specimen; and
    an intermediate lens configured to receive light energy reflected from the Mangin element and the catadioptric element;
    wherein one of the catadioptric element and intermediate lens comprises an aspheric surface, and further wherein the Mangin element is spatially configured to facilitate dark-field inspection of the specimen.

14. The objective of claim 13, wherein the objective supports light energy having a bandwidth of at least 0.25 nm.

15. The objective of claim 13, wherein the Mangin element comprises an extension element.

16. The objective of claim 15, wherein the extension element is separately formed from the Mangin element and attached to the Mangin element.

17. The objective of claim 15, wherein the extension element is integrally formed with the Mangin element.

18. The objective of claim 13, wherein the objective is configured to be employed with a laser beam delivery system external to the objective and in proximity to the Mangin element and deliver a laser beam to the specimen.

19. A specimen inspection apparatus configured to inspect a specimen, comprising:
- a light energy source; and
- an objective comprising:
  - a Mangin element comprising a reflective surface positioned substantially proximate the specimen in an orientation causing light energy to reflect away from the specimen;
  - a catadioptric element comprising a substantially curved reflective surface positioned to reflect light energy toward the specimen; and
  - an intermediate lens configured to receive light energy reflected from the Mangin element and the catadioptric element;
- wherein one of the catadioptric element and intermediate lens comprises an aspheric surface.

20. The specimen inspection apparatus of claim 19, wherein the objective supports light energy having a bandwidth of at least 0.25 nm.

21. The specimen inspection apparatus of claim 19, wherein the Mangin element comprises an extension element.

22. The specimen inspection apparatus of claim 21, wherein the extension element is separately formed from the Mangin element and attached to the Mangin element.

23. The specimen inspection apparatus of claim 21, wherein the extension element is integrally formed with the Mangin element.

24. The specimen inspection apparatus of claim 19, wherein the light energy source comprises a laser beam delivery system external to the objective configured to deliver a laser beam to the specimen.

25. The specimen inspection apparatus of claim 19, wherein the objective further comprises a pupil aperture configured to be employed during dark-field inspection.

26. The specimen inspection apparatus of claim 19, further comprising a detector configured to accommodate high dynamic range signals produced by dark-field inspection.

27. The specimen inspection apparatus of claim 19, wherein the aspheric surface is the surface of the Mangin element.

28. The specimen inspection apparatus of claim 19, wherein the aspheric surface is the surface of the intermediate lens.

29. The specimen inspection apparatus of claim 19, wherein the aspheric surface is one surface of the catadioptric element.

30. The specimen inspection apparatus of claim 19, wherein the objective provides a polychromatic Strehl ratio of greater than 0.9 across the field.

31. The specimen inspection apparatus of claim 19, wherein the objective is made from a single glass material.

* * * * *